(12) United States Patent
Krasulick et al.

(10) Patent No.: US 12,287,510 B2
(45) Date of Patent: Apr. 29, 2025

(54) INTEGRATION OF AN UNPROCESSED, DIRECT-BANDGAP CHIP INTO A SILICON PHOTONIC DEVICE

(71) Applicant: Skorpios Technologies, Inc., Albuquerque, NM (US)

(72) Inventors: Stephen B. Krasulick, Albuquerque, NM (US); John Dallesasse, Geneva, IL (US); Amit Mizrahi, San Francisco, CA (US); Timothy Creazzo, Albuquerque, NM (US); Elton Marchena, Albuquerque, NM (US); John Y. Spann, Albuquerque, NM (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 17/520,467

(22) Filed: Nov. 5, 2021

(65) Prior Publication Data

US 2022/0171125 A1    Jun. 2, 2022

Related U.S. Application Data

(63) Continuation of application No. 15/073,957, filed on Mar. 18, 2016, now Pat. No. 11,181,688, which is a
(Continued)

(51) Int. Cl.
*G02B 6/12* (2006.01)
*H01S 5/02326* (2021.01)
(Continued)

(52) U.S. Cl.
CPC ...... *G02B 6/12004* (2013.01); *H01S 5/02326* (2021.01); *G02B 2006/12176* (2013.01);
(Continued)

(58) Field of Classification Search
None
See application file for complete search history.

(56) References Cited

U.S. PATENT DOCUMENTS

| 4,182,545 A | 1/1980 | Greer |
| 4,293,826 A | 10/1981 | Scifres et al. |

(Continued)

FOREIGN PATENT DOCUMENTS

| EP | 696747 A2 | 2/1996 |
| EP | 2141525 A1 | 1/2010 |

(Continued)

OTHER PUBLICATIONS

Analui et al., "A Fully Integrated 20-GB/s Optoelectronic Transceiver Implemented in a Standard 0.13-μm CMOS SOI Technology", IEEE Journal of Solid-State Circuits, vol. 41, No. 12, Dec. 2006, pp. 2945-2955.

(Continued)

*Primary Examiner* — Chris H Chu
(74) *Attorney, Agent, or Firm* — Kilpatrick Townsend & Stockton LLP

(57) ABSTRACT

A composite device for splitting photonic functionality across two or more materials comprises a platform, a chip, and a bond securing the chip to the platform. The platform comprises a base layer and a device layer. The device layer comprises silicon and has an opening exposing a portion of the base layer. The chip, a material, comprises an active region (e.g., gain medium for a laser). The chip is bonded to the portion of the base layer exposed by the opening, such that the active region of the chip is aligned with the device layer of the platform.

20 Claims, 24 Drawing Sheets

Related U.S. Application Data continuation-in-part of application No. 14/509,914, filed on Oct. 8, 2014, now Pat. No. 9,316,785, and a continuation-in-part of application No. 14/488,041, filed on Sep. 16, 2014, now abandoned, and a continuation-in-part of application No. 14/262,529, filed on Apr. 25, 2014, now Pat. No. 9,324,682, and a continuation-in-part of application No. 13/605,633, filed on Sep. 6, 2012, now Pat. No. 9,318,868, said application No. 14/488,041 is a continuation of application No. 13/040,181, filed on Mar. 3, 2011, now Pat. No. 8,867,578, which is a continuation-in-part of application No. 12/903,025, filed on Oct. 12, 2010, now Pat. No. 8,615,025.

(60) Provisional application No. 62/028,611, filed on Jul. 24, 2014, provisional application No. 61/888,863, filed on Oct. 9, 2013, provisional application No. 61/815,938, filed on Apr. 25, 2013, provisional application No. 61/532,050, filed on Sep. 7, 2011, provisional application No. 61/251,143, filed on Oct. 13, 2009.

(51) Int. Cl.
 *H01S 5/00* (2006.01)
 *H01S 5/14* (2006.01)

(52) U.S. Cl.
 CPC ..... *H01L 2224/32225* (2013.01); *H01S 5/005* (2013.01); *H01S 5/14* (2013.01)

(56) References Cited

U.S. PATENT DOCUMENTS

| | | | |
|---|---|---|---|
| 4,892,374 A | 1/1990 | Ackerman et al. | |
| 5,023,881 A | 6/1991 | Ackerman et al. | |
| 5,162,258 A * | 11/1992 | Lemnios | H01L 27/118 257/E27.105 |
| 5,190,883 A | 3/1993 | Menigaux et al. | |
| 5,319,667 A | 6/1994 | Dutting et al. | |
| 5,321,786 A | 6/1994 | Valette et al. | |
| 5,333,219 A | 7/1994 | Kuznetsov | |
| 5,488,678 A | 1/1996 | Taneya et al. | |
| 5,600,745 A * | 2/1997 | Wuu | G02B 6/132 385/49 |
| 5,656,507 A | 8/1997 | Welbourn et al. | |
| 5,757,986 A | 5/1998 | Crampton et al. | |
| 5,780,875 A | 7/1998 | Tsuji et al. | |
| 5,821,604 A | 10/1998 | Egawa | |
| 5,838,070 A | 11/1998 | Naruse et al. | |
| 5,858,814 A | 1/1999 | Goossen et al. | |
| 5,898,806 A | 4/1999 | Nishimoto | |
| 5,907,646 A | 5/1999 | Kitamura | |
| 5,981,400 A | 11/1999 | Lo | |
| 5,987,050 A | 11/1999 | Doerr et al. | |
| 6,009,218 A | 12/1999 | Grand et al. | |
| 6,052,500 A | 4/2000 | Takano et al. | |
| 6,101,210 A | 8/2000 | Bestwick et al. | |
| 6,164,836 A | 12/2000 | Yamada et al. | |
| 6,192,058 B1 | 2/2001 | Abeles | |
| 6,222,967 B1 | 4/2001 | Amano et al. | |
| 6,250,819 B1 * | 6/2001 | Porte | G02B 6/423 385/88 |
| 6,313,529 B1 | 11/2001 | Yoshihara et al. | |
| 6,344,148 B1 | 2/2002 | Park et al. | |
| 6,393,171 B2 | 5/2002 | Sasaki et al. | |
| 6,443,631 B1 | 9/2002 | Case et al. | |
| 6,485,993 B2 | 11/2002 | Trezza et al. | |
| 6,643,434 B2 | 11/2003 | Cayrefourcq et al. | |
| 6,667,237 B1 | 12/2003 | Metzler | |
| 6,674,159 B1 | 1/2004 | Peterson et al. | |
| 6,690,857 B2 | 2/2004 | Zhao et al. | |
| 6,714,566 B1 | 3/2004 | Coldren et al. | |
| 6,728,279 B1 | 4/2004 | Sarlet et al. | |
| 6,759,746 B1 | 7/2004 | Davies | |
| 6,804,444 B2 | 10/2004 | Shin et al. | |
| 6,848,309 B2 | 2/2005 | Sakai | |
| 6,876,093 B2 | 4/2005 | Goto et al. | |
| 6,888,989 B1 * | 5/2005 | Zhou | G02B 6/423 385/14 |
| 6,931,178 B2 | 8/2005 | Saccomanno | |
| 6,942,396 B2 | 9/2005 | Marion et al. | |
| 6,987,913 B2 | 1/2006 | Blauvelt et al. | |
| 7,058,096 B2 | 6/2006 | Sarlet et al. | |
| 7,095,928 B2 | 8/2006 | Blauvelt et al. | |
| 7,256,483 B2 | 8/2007 | Epler et al. | |
| 7,257,283 B1 | 8/2007 | Liu et al. | |
| 7,272,974 B2 | 9/2007 | Goto | |
| 7,303,339 B2 | 12/2007 | Zhou et al. | |
| 7,326,611 B2 | 2/2008 | Forbes | |
| 7,473,936 B2 * | 1/2009 | Tran | H01L 33/22 438/22 |
| 7,529,442 B2 | 5/2009 | Glebov et al. | |
| 7,531,395 B2 | 5/2009 | Blomiley et al. | |
| 7,563,625 B2 * | 7/2009 | Tran | H01L 33/22 257/E21.216 |
| 7,633,988 B2 | 12/2009 | Fish et al. | |
| 7,646,033 B2 | 1/2010 | Tran et al. | |
| 7,701,985 B2 | 4/2010 | Webster et al. | |
| 7,812,416 B2 | 10/2010 | Courcimault | |
| 7,842,547 B2 | 11/2010 | Shelton et al. | |
| 7,928,546 B2 | 4/2011 | Ohno et al. | |
| 7,939,934 B2 | 5/2011 | Haba et al. | |
| 7,972,875 B2 | 7/2011 | Rogers et al. | |
| 8,036,507 B2 | 10/2011 | Watanabe | |
| 8,106,379 B2 | 1/2012 | Bowers | |
| 8,110,421 B2 | 2/2012 | Sugizaki et al. | |
| 8,115,218 B2 | 2/2012 | Tsai et al. | |
| 8,156,804 B2 | 4/2012 | Sakai et al. | |
| 8,222,084 B2 | 7/2012 | Dallesasse et al. | |
| 8,225,660 B2 | 7/2012 | Sakai et al. | |
| 8,254,735 B2 | 8/2012 | Tsai | |
| 8,265,436 B2 | 9/2012 | Shih et al. | |
| 8,283,683 B2 | 10/2012 | Tsai et al. | |
| 8,290,014 B2 | 10/2012 | Junesand et al. | |
| 8,312,770 B2 | 11/2012 | Fukaura | |
| 8,345,517 B2 | 1/2013 | Hurley et al. | |
| 8,368,995 B2 | 2/2013 | Dallesasse et al. | |
| 8,445,326 B2 | 5/2013 | Dallesasse et al. | |
| 8,559,470 B2 | 10/2013 | Dallesasse et al. | |
| 8,605,766 B2 | 12/2013 | Dallesasse et al. | |
| 8,611,388 B2 | 12/2013 | Krasulick et al. | |
| 8,615,025 B2 | 12/2013 | Dallesasse et al. | |
| 8,630,326 B2 | 1/2014 | Krasulick et al. | |
| 8,647,962 B2 | 2/2014 | Liu et al. | |
| 8,654,810 B2 | 2/2014 | Fukasawa et al. | |
| 8,722,464 B2 | 5/2014 | Dallesasse et al. | |
| 8,742,557 B2 | 6/2014 | Eskridge | |
| 8,859,394 B2 | 10/2014 | Dallesasse et al. | |
| 8,867,578 B2 | 10/2014 | Dallesasse et al. | |
| 8,871,554 B2 | 10/2014 | Hill et al. | |
| 8,873,903 B2 | 10/2014 | Wessel | |
| 9,217,836 B2 | 12/2015 | Asghari et al. | |
| 9,227,257 B2 | 1/2016 | Hurley et al. | |
| 9,882,073 B2 | 1/2018 | Krasulick et al. | |
| 9,923,105 B2 | 3/2018 | Krasulick et al. | |
| 11,181,688 B2 | 11/2021 | Krasulick et al. | |
| 11,614,690 B2 * | 3/2023 | Feng | G03F 7/705 700/105 |
| 2001/0010743 A1 | 8/2001 | Cayrefourcq et al. | |
| 2002/0000646 A1 | 1/2002 | Gooch et al. | |
| 2002/0031307 A1 | 3/2002 | Kimura | |
| 2002/0031711 A1 | 3/2002 | Steinberg et al. | |
| 2002/0110328 A1 * | 8/2002 | Bischel | G02B 6/4201 385/27 |
| 2002/0146047 A1 | 10/2002 | Bendett et al. | |
| 2002/0197013 A1 | 12/2002 | Liu et al. | |
| 2003/0042494 A1 | 3/2003 | Worley | |
| 2003/0081878 A1 * | 5/2003 | Joyner | H01S 5/4031 385/14 |
| 2003/0128724 A1 | 7/2003 | Morthier | |

(56) References Cited

U.S. PATENT DOCUMENTS

| | | |
|---|---|---|
| 2004/0017962 A1 | 1/2004 | Lee et al. |
| 2004/0036546 A1 | 2/2004 | Arai et al. |
| 2004/0037342 A1 | 2/2004 | Blauvelt et al. |
| 2004/0037500 A1 | 2/2004 | Yoo |
| 2004/0043533 A1 | 3/2004 | Chua et al. |
| 2004/0077135 A1 | 4/2004 | Fan et al. |
| 2004/0182914 A1 | 9/2004 | Venugopalan |
| 2004/0228384 A1 | 11/2004 | Oh et al. |
| 2004/0245425 A1 | 12/2004 | Delpiano et al. |
| 2004/0253792 A1 | 12/2004 | Cohen et al. |
| 2004/0259279 A1 | 12/2004 | Erchak et al. |
| 2004/0264840 A1 | 12/2004 | Mule et al. |
| 2005/0058416 A1 | 3/2005 | Hoon Lee et al. |
| 2005/0082552 A1 | 4/2005 | Fang et al. |
| 2005/0129361 A1 | 6/2005 | Kim et al. |
| 2005/0129631 A1 | 6/2005 | Goppel et al. |
| 2005/0205951 A1 | 9/2005 | Eskridge |
| 2005/0211465 A1* | 9/2005 | Sunohara ......... H01L 23/5389 361/764 |
| 2005/0211993 A1 | 9/2005 | Sano et al. |
| 2005/0213618 A1 | 9/2005 | Sochava et al. |
| 2005/0226284 A1 | 10/2005 | Tanaka et al. |
| 2005/0249509 A1 | 11/2005 | Nagarajan et al. |
| 2006/0002443 A1 | 1/2006 | Farber et al. |
| 2006/0093002 A1* | 5/2006 | Park ............... H01S 5/0236 372/50.1 |
| 2006/0104322 A1 | 5/2006 | Park et al. |
| 2007/0002924 A1 | 1/2007 | Hutchinson et al. |
| 2007/0228404 A1 | 10/2007 | Tran et al. |
| 2007/0280326 A1 | 12/2007 | Piede et al. |
| 2008/0025355 A1 | 1/2008 | Hu et al. |
| 2008/0266639 A1 | 10/2008 | Melloni et al. |
| 2009/0016399 A1 | 1/2009 | Bowers |
| 2009/0065891 A1 | 3/2009 | Dantz et al. |
| 2009/0135861 A1 | 5/2009 | Webster et al. |
| 2009/0174930 A1 | 7/2009 | McCahon et al. |
| 2009/0225796 A1 | 9/2009 | Kato |
| 2009/0263143 A1 | 10/2009 | Pelley et al. |
| 2009/0267173 A1 | 10/2009 | Takahashi et al. |
| 2009/0278233 A1 | 11/2009 | Pinnington et al. |
| 2009/0294803 A1 | 12/2009 | Nuzzo et al. |
| 2009/0294814 A1 | 12/2009 | Assefa et al. |
| 2009/0310140 A1 | 12/2009 | Smith et al. |
| 2010/0040327 A1 | 2/2010 | Deki et al. |
| 2010/0059822 A1 | 3/2010 | Pinguet et al. |
| 2010/0111128 A1 | 5/2010 | Qin et al. |
| 2010/0123145 A1 | 5/2010 | Lee |
| 2010/0142567 A1 | 6/2010 | Ward et al. |
| 2010/0142571 A1 | 6/2010 | Park et al. |
| 2010/0148341 A1 | 6/2010 | Fuji et al. |
| 2010/0173437 A1 | 7/2010 | Wygant et al. |
| 2010/0215073 A1 | 8/2010 | Fukasawa et al. |
| 2010/0247037 A1 | 9/2010 | Little |
| 2011/0007761 A1 | 1/2011 | Assefa et al. |
| 2011/0012261 A1 | 1/2011 | Choi et al. |
| 2011/0032964 A1 | 2/2011 | Sauer et al. |
| 2011/0085577 A1 | 4/2011 | Krasulick et al. |
| 2011/0085760 A1 | 4/2011 | Han et al. |
| 2011/0089524 A1 | 4/2011 | Nonogaki |
| 2011/0158584 A1 | 6/2011 | Popovic |
| 2011/0163444 A1 | 7/2011 | Hayashi |
| 2011/0165707 A1 | 7/2011 | Lott et al. |
| 2011/0211604 A1 | 9/2011 | Roscher |
| 2011/0216997 A1 | 9/2011 | Gothoskar et al. |
| 2011/0244613 A1 | 10/2011 | Heck et al. |
| 2012/0001166 A1 | 1/2012 | Doany et al. |
| 2012/0002694 A1 | 1/2012 | Bowers et al. |
| 2012/0002931 A1 | 1/2012 | Watanabe |
| 2012/0057610 A1 | 3/2012 | Dallesasse et al. |
| 2012/0057816 A1 | 3/2012 | Krasulick et al. |
| 2012/0091594 A1* | 4/2012 | Landesberger ......... H01L 24/19 257/E23.068 |
| 2012/0120978 A1 | 5/2012 | Budd et al. |
| 2012/0149148 A1 | 6/2012 | Dallesasse et al. |
| 2012/0170931 A1 | 7/2012 | Evans et al. |
| 2012/0170942 A1* | 7/2012 | Snyman ............. H01L 33/0004 398/142 |
| 2012/0189317 A1 | 7/2012 | Heck et al. |
| 2012/0264256 A1 | 10/2012 | Dallesasse et al. |
| 2012/0295405 A1 | 11/2012 | Babiarz et al. |
| 2012/0320939 A1 | 12/2012 | Baets et al. |
| 2013/0026545 A1* | 1/2013 | Dix ..................... H01L 29/0847 257/E21.409 |
| 2013/0037905 A1 | 2/2013 | Shubin et al. |
| 2013/0051727 A1 | 2/2013 | Mizrahi et al. |
| 2013/0064497 A1* | 3/2013 | Iwai ..................... B82Y 20/00 257/E33.071 |
| 2013/0109136 A1 | 5/2013 | Foote et al. |
| 2013/0189804 A1 | 7/2013 | Marchena |
| 2013/0210214 A1 | 8/2013 | Dallesasse et al. |
| 2013/0251299 A1 | 9/2013 | He et al. |
| 2013/0301975 A1 | 11/2013 | Spann et al. |
| 2013/0302920 A1 | 11/2013 | Dallesasse et al. |
| 2014/0185980 A1 | 7/2014 | Lei et al. |
| 2014/0264844 A1 | 9/2014 | Ying et al. |
| 2015/0049374 A1 | 2/2015 | Hofmann et al. |
| 2015/0097257 A1* | 4/2015 | Gambino ............... G02B 6/122 438/69 |
| 2015/0123157 A1 | 5/2015 | Dallesasse et al. |
| 2015/0285998 A1 | 10/2015 | Babakhani et al. |

FOREIGN PATENT DOCUMENTS

| | | |
|---|---|---|
| EP | 2648906 A1 | 10/2013 |
| JP | H0961676 A | 3/1997 |
| JP | H10200153 A | 7/1998 |
| JP | 2000089054 A | 3/2000 |
| JP | 2002520858 A | 7/2002 |
| JP | 2003172835 A | 6/2003 |
| JP | 2003233022 A | 8/2003 |
| JP | 2004063730 A | 2/2004 |
| JP | 2004157192 A | 6/2004 |
| JP | 2005045048 A | 2/2005 |
| JP | 2006053472 A | 2/2006 |
| JP | 2006269543 A | 10/2006 |
| JP | 2007525691 A | 9/2007 |
| JP | 2009534712 A | 9/2009 |
| JP | 2009244868 A | 10/2009 |
| JP | 2010177539 A | 8/2010 |
| JP | 2012151327 A | 8/2012 |
| JP | 2013507792 A | 3/2013 |
| JP | 6612219 B2 | 11/2019 |
| KR | 1020050059638 A | 6/2005 |
| TW | 543143 B | 7/2003 |
| TW | 200845520 A | 11/2008 |
| TW | 201140975 A | 11/2011 |
| WO | 0003461 A1 | 1/2000 |
| WO | 2011046898 A | 4/2011 |
| WO | 2011046898 A1 | 4/2011 |
| WO | 2012078361 A1 | 6/2012 |
| WO | 2013033252 A1 | 3/2013 |
| WO | 2013103769 A1 | 7/2013 |
| WO | 2013109955 A1 | 7/2013 |
| WO | 2014025824 A2 | 2/2014 |
| WO | 2014176561 A1 | 10/2014 |
| WO | 2015054491 A1 | 4/2015 |

OTHER PUBLICATIONS

Barkai et al., "Efficient Mode Converter for Coupling Between Fiber and Micrometer Size Silicon Waveguides", 4th IEEE International Conference on Group IV Photonics, Sep. 19-21, 2007, pp. 49-51.

Coldren, "Monolithic Tunable Diode Lasers", Institute of Electrical and Electronics Engineers Journal on Selected Topics In Quantum Electronics, vol. 6, No. 6, Nov./Dec. 2000, pp. 988-999.

Coldren et al., "Tunable Semiconductor Lasers: A Tutorial", Journal of Lightwave Technology, vol. 22, No. 1, Jan. 2004, pp. 193-202.

Fang et al., "Integrated AlGaInAs-silicon evanescent racetrack laser and photodetector", Optics Express (2007), vol. 15, No. 5, Mar. 5, 2007, pp. 2315-2322.

(56) References Cited

OTHER PUBLICATIONS

Hildebrand et al., "The Y-Laser: A Multifunctional Device for Optical Communication Systems and Switching Networks", Journal of Lightwave Technology, vol. 11, No. 12, Dec. 1993, pp. 2066-2075.
Isaksson et al., "10 GB/s Direct Modulation of 40 nm Tunable Modulated-Grating Y-branch Laser", OTuE2, Optical Fiber Communication Conference and Exposition and The National Fiber Optic Engineers Conference, Mar. 6-11, 2005, 3 pages.
Khilo et al., "Efficient Planar Fiber-to-Chip Coupler Based on Two-Stage Adiabatic Evolution", Optics Express, vol. 18, No. 15, Jul. 19, 2010, pp. 15790-15806.
Kuznetsov et al., "Asymmetric Y-Branch Tunable Semiconductor Laser with 1.0 THz Tuning Range", Institute of Electrical and Electronics Engineers Photonics Technology Letters, vol. 4, No. 10, Oct. 1992, pp. 1093-1095.
Laroy et al., "Characteristics of the New Modulated Grating Y laser (MG-Y) for Future WDM Networks", Institute of Electrical and Electronics Engineers /Leos Benelux Chapter, Available online At: http://leosbenelux.org/symp03/s03p055.pdf, Nov. 2003, 3 pages.
Laroy, "New Concepts of Wavelength Tunable Laser Diodes For Future Telecom Networks", Universiteit Gent, 2006, 162 pages.
Laroy et al., "New Widely Tunable Laser Concepts For Future Telecommunication Networks", FTW-symposium, Belgium, Available online At: http://photonics.intec.ugent.be/download/pub_1625.pdf, Dec. 11, 2002, 2 pages.
Li et al., "A CMOS Wafer-Scale, Monolithically Integrated WDM Platform for T8/s Optical Interconnects", OFC (2014) Available Online at :- https://www.osapublishing.org/viewmedia.cfm?uri=OFC-2014-Th1C.2&seq=0, 2014, 3 pages.
Magno et al., "Multiphysics Investigation of Thermo-Optic Effect in Silicon-on-Insulator Waveguide Arrays", Excerpt from the Proceedings of the COMSOL Users Conference, Available online At: http://cds.comsol.com/access/dl/papers/1628/Magno.pdf, 2006, 6 pages.
Marchena et al., "Integrated Tunable CMOS Laser for Si Photonics", Optical Fiber Communication Conference and Exposition and The National Fiber Optic Engineers Conference (OFC/NFOEC), 2013, pp. 1-4.
Morthier, "Advanced Widely Tunable Edge-Emitting Laser Diodes and Their Application in Optical Communications", Ghent University—IMEC, Available online At: broadband02.ici.ro/program/morthier_3a.ppt, 2000, 23 pages.
Morthier et al., "New Widely Tunable Edge-Emitting Laser Diodes at 1.55 μm Developed in the European IST-project NEWTON", Semiconductor and Organic Optoelectronic Materials and Devices, Available online At: http://photonics.intec.ugent.be/download/pub_1800.pdf, Feb. 28, 2005, pp. 1-8.
Morthier, "New Widely Tunable Lasers for Optical Networks", NEWTON Project No. IST-2000-28244, Available online At: http://www.istoptimist.unibo.it/pdf/network/projects_public/NEWTON/Deliverables/D01.pdf, Dec. 2001, 5 pages.
Park et al., "A Fiber-to-Chip Coupler Based on Si/SiON Cascaded Tapers for Si Photonic Chips", Optics Express, vol. 21, No. 24, Dec. 2, 2013, pp. 29313-29319.
Passaro et al., "Investigation of Thermo-Optic Effect and Multireflector Tunable Filter/Multiplexer in SOI Waveguides", Optics Express, vol. 13, No. 9, May 2, 2005, pp. 3429-3437.
Wesstrom et al., "Design of a Widely Tunable Modulated Grating Y-branch Laser Using the Additive Vernier Effect for Improved Super-Mode Selection", Institute of Electrical and Electronics Engineers, 18th International Semiconductor Laser Conference, Available online At: http://photonics.intec.ugent.be/download/pub_1603.pdf, 2002, pp. 99-100.
Wesstrom et al., "State-of-the-Art Performance of Widely Tunable Modulated Grating Y-Branch Lasers", Optical Fiber Communication Conference, Dec. 13, 2004, 5 pages.
China Application No. CN201480055779.5, Office Action, Mailed on Aug. 2, 2019, 12 pages.
China Application No. CN201480055779.5, Office Action, Mailed on Apr. 2, 2020, 6 pages.
European Supplemental Search Report mailed on Apr. 9, 2015 for International Patent Application No. 12827040.2-1553 filed on Aug. 29, 2012, all pages.
Extended European Search Report mailed Aug. 10, 2015 for European Patent Application No. 13738701 .5; all pages.
Extended European Search Report mailed Jul. 6, 2017 for European Patent Application No. 14851684.2; all pages.
Japan Application No. JP2016-521282, Office Action, Mailed on Oct. 29, 2018, 22 pages.
International Application No. PCT/US2010/052249, International Search Report and Written Opinion, Mailed on Feb. 15, 2011, 14 pages.
International Application No. PCT/US2011/061951, International Search Report and Written Opinion, Mailed on Mar. 21, 2012, 7 pages.
International Application No. PCT/US2012/052913, International Search Report and Written Opinion, Mailed on Nov. 16, 2012, 14 pages.
International Application No. PCT/US2013/020226, International Preliminary Report on Patentability, Mailed on Jul. 17, 2014, 9 pages.
International Application No. PCT/US2013/020226, International Search Report and Written Opinion, Mailed on Mar. 1, 2013, 10 pages.
International Application No. PCT/US2013/022244, International Preliminary Report on Patentability, Mailed on Jul. 31, 2014, 6 pages.
International Application No. PCT/US2013/022244, International Search Report and Written Opinion, Mailed on May 15, 2013, 10 pages.
International Application No. PCT/US2013/053856, International Search Report and Written Opinion, Mailed on Jan. 29, 2014, 8 pages.
International Application No. PCT/US2014/035563, International Search Report and Written Opinion, Mailed on Aug. 27, 2014, 10 pages.
International Application No. PCT/US2014/059900, International Preliminary Report on Patentability, Mailed on Apr. 21, 2016, 10 pages.
U.S. Appl. No. 12/902,621, Non-Final Office Action, Mailed on Apr. 23, 2013, 14 pages.
U.S. Appl. No. 12/902,621, Non-Final Office Action, Mailed on Sep. 18, 2012, 15 pages.
U.S. Appl. No. 12/902,621, Notice of Allowance, Mailed on Oct. 2, 2013, 11 pages.
U.S. Appl. No. 12/902,621, "Restriction Requirement", May 17, 2012, 8 pages.
U.S. Appl. No. 12/903,025, Final Office Action, Mailed on May 29, 2013, 11 pages.
U.S. Appl. No. 12/903,025, Final Office Action, Mailed on May 16, 2012, 14 pages.
U.S. Appl. No. 12/903,025, Non-Final Office Action, Mailed on Dec. 29, 2011, 13 pages.
U.S. Appl. No. 12/903,025, Non-Final Office Action, Mailed on Dec. 5, 2012, 14 pages.
U.S. Appl. No. 12/903,025, Notice of Allowance, Mailed on Aug. 8, 2013, 9 pages.
U.S. Appl. No. 13/040,154, Final Office Action, Mailed on Jun. 17, 2013, 12 pages.
U.S. Appl. No. 13/040,154, Final Office Action, Mailed on May 16, 2012, 14 pages.
U.S. Appl. No. 13/040,154, Non-Final Office Action, Mailed on Jan. 31, 2012, 14 pages.
U.S. Appl. No. 13/040,154, Non-Final Office Action, Mailed on Dec. 4, 2012, 16 pages.
U.S. Appl. No. 13/040,154, Notice of Allowance, Mailed on Jul. 26, 2013, 10 pages.
U.S. Appl. No. 13/040,154, Office Action Response, Mailed on Apr. 30, 2012, 19 pages.
U.S. Appl. No. 13/040,179, Final Office Action, Mailed on Aug. 13, 2012, 15 pages.
U.S. Appl. No. 13/040,179, Non-Final Office Action, Mailed on Mar. 13, 2012, 14 pages.

(56) References Cited

OTHER PUBLICATIONS

U.S. Appl. No. 13/040,179, Non-Final Office Action, Mailed on Dec. 12, 2012, 15 pages.
U.S. Appl. No. 13/040,179, Notice of Allowance, Mailed on Jun. 12, 2013, 9 pages.
U.S. Appl. No. 13/040,181, Final Office Action, Mailed on Dec. 5, 2012, 13 pages.
U.S. Appl. No. 13/040,181, Non-Final Office Action, Mailed on May 22, 2012, 13 pages.
U.S. Appl. No. 13/040,181, Notice of Allowance, Mailed on Jun. 16, 2014, 11 pages.
U.S. Appl. No. 13/040,184, Non-Final Office Action, Mailed on Apr. 23, 2013, 19 pages.
U.S. Appl. No. 13/040,184, Notice of Allowance, Mailed on Oct. 4, 2013, 13 pages.
U.S. Appl. No. 13/040,184, "Restriction Requirement", Dec. 21, 2012, 8 pages.
U.S. Appl. No. 13/076,205, Notice of Allowance, Mailed on Sep. 19, 2012, 10 pages.
U.S. Appl. No. 13/112,142, Notice of Allowance, Mailed on Mar. 20, 2012, 9 pages.
U.S. Appl. No. 13/527,394, Non-Final Office Action, Mailed on Aug. 31, 2012, 6 pages.
U.S. Appl. No. 13/527,394, Notice of Allowance, Mailed on Jan. 29, 2013, 8 pages.
U.S. Appl. No. 13/605,633, Advisory Action, Mailed on Oct. 20, 2014, 3 pages.
U.S. Appl. No. 13/605,633, Final Office Action, Mailed on Jul. 7, 2014, 11 pages.
U.S. Appl. No. 13/605,633, Final Office Action, Mailed on Sep. 2, 2015, 13 pages.
U.S. Appl. No. 13/605,633, Final Office Action, Mailed on May 11, 2015, 8 pages.
U.S. Appl. No. 13/605,633, Non-Final Office Action, Mailed on Dec. 18, 2014, 13 pages.
U.S. Appl. No. 13/605,633, Notice of Allowance, Mailed on Dec. 15, 2015, 8 pages.
U.S. Appl. No. 13/733,337, Notice of Allowance, Mailed on Jan. 17, 2014, 5 pages.
U.S. Appl. No. 13/869,408, Non-Final Office Action, Mailed on Aug. 30, 2013, 6 pages.
U.S. Appl. No. 13/869,408, Notice of Allowance, Mailed on Jan. 6, 2014, 9 pages.
U.S. Appl. No. 14/135,006, Non-Final Office Action, Mailed on Feb. 6, 2015, 11 pages.
U.S. Appl. No. 14/135,006, Notice of Allowance, Mailed on Jul. 17, 2015, 8 pages.
U.S. Appl. No. 14/262,529, Advisory Action, Mailed on Dec. 3, 2015, 3 pages.
U.S. Appl. No. 14/262,529, Final Office Action, Mailed on Sep. 29, 2015, 11 pages.
U.S. Appl. No. 14/262,529, Non-Final Office Action, Mailed on Apr. 20, 2015, 12 pages.
U.S. Appl. No. 14/262,529, Non-Final Office Action, Mailed on Dec. 1, 2014, 12 pages.
U.S. Appl. No. 14/262,529, Notice of Allowance, Mailed on Jan. 11, 2016, 9 pages.
U.S. Appl. No. 14/482,650, "Applicant-Initiated Interview Summary", Dec. 29, 2016, 4 pages.
U.S. Appl. No. 14/482,650, Final Office Action Response, Mailed on Dec. 27, 2016.
U.S. Appl. No. 14/482,650, Final Office Action Response, Mailed on Jan. 19, 2017.
U.S. Appl. No. 14/482,650, Non-Final Office Action, Mailed on Apr. 21, 2016, 10 pages.
U.S. Appl. No. 14/482,650, Non-Final Office Action Response, Mailed on Jul. 21, 2016.
U.S. Appl. No. 14/482,650, "Restriction Requirement Response", mailed on Nov. 23, 2015.
U.S. Appl. No. 14/488,041, Final Office Action, Mailed on Jul. 19, 2016, 12 pages.
U.S. Appl. No. 14/488,041, Final Office Action, Mailed on Nov. 6, 2015, 13 pages.
U.S. Appl. No. 14/488,041, Non-Final Office Action, Mailed on Feb. 22, 2016, 14 pages.
U.S. Appl. No. 14/488,041, Non-Final Office Action, Mailed on May 13, 2015, 14 pages.
U.S. Appl. No. 14/509,914, "Ex Parte Quayle Action", Mailed on Aug. 28, 2015, 7 pages.
U.S. Appl. No. 14/509,914, Notice of Allowance, Mailed on Dec. 21, 2015, 8 pages.
U.S. Appl. No. 14/509,971, Final Office Action, Mailed on Apr. 14, 2016, 15 pages.
U.S. Appl. No. 14/509,971, Non-Final Office Action, Mailed on Oct. 7, 2015, 15 pages.
U.S. Appl. No. 14/509,971, Notice of Allowance, Mailed on Jul. 7, 2016, 13 pages.
U.S. Appl. No. 14/509,975, First Action Interview Pilot Program Pre-Interview Communication, Mailed on Feb. 24, 2017, 4 pages.
U.S. Appl. No. 14/509,975, Notice of Allowance, Mailed on Jul. 12, 2017, 14 pages.
U.S. Appl. No. 14/509,975, Notice of Allowance, Mailed on Aug. 31, 2017, 4 pages.
U.S. Appl. No. 14/509,975, Notice of Allowance, Mailed on Nov. 17, 2017, 7 pages.
U.S. Appl. No. 14/509,975, "Restriction Requirement", Mailed on Aug. 3, 2016, 5 pages.
U.S. Appl. No. 14/509,979, Final Office Action, Mailed on Jul. 14, 2017, 13 pages.
U.S. Appl. No. 14/509,979, Final Office Action, Mailed on Apr. 14, 2016, 16 pages.
U.S. Appl. No. 14/509,979, Non-Final Office Action, Mailed on Nov. 3, 2016, 14 pages.
U.S. Appl. No. 14/509,979, Non-Final Office Action, Mailed on Oct. 2, 2015, 16 pages.
U.S. Appl. No. 14/509,979, Notice of Allowance, Mailed on Sep. 20, 2017, 7 pages.
U.S. Appl. No. 14/509,979, "U.S. Appl. No.", Oct. 8, 2014.
U.S. Appl. No. 15/073,957, Final Office Action, Mailed on Dec. 17, 2020, 12 pages.
U.S. Appl. No. 15/073,957, Final Office Action, Mailed on Dec. 13, 2018, 13 pages.
U.S. Appl. No. 15/073,957, Non-Final Office Action, Mailed on Aug. 7, 2019, 11 pages.
U.S. Appl. No. 15/073,957, Non-Final Office Action, Mailed on Mar. 9, 2018, 11 pages.
U.S. Appl. No. 15/073,957, Notice of Allowance, Mailed on Jul. 22, 2021, 8 pages.
U.S. Appl. No. 15/073,957, "Restriction Requirement", Aug. 29, 2017, 5 pages.

\* cited by examiner

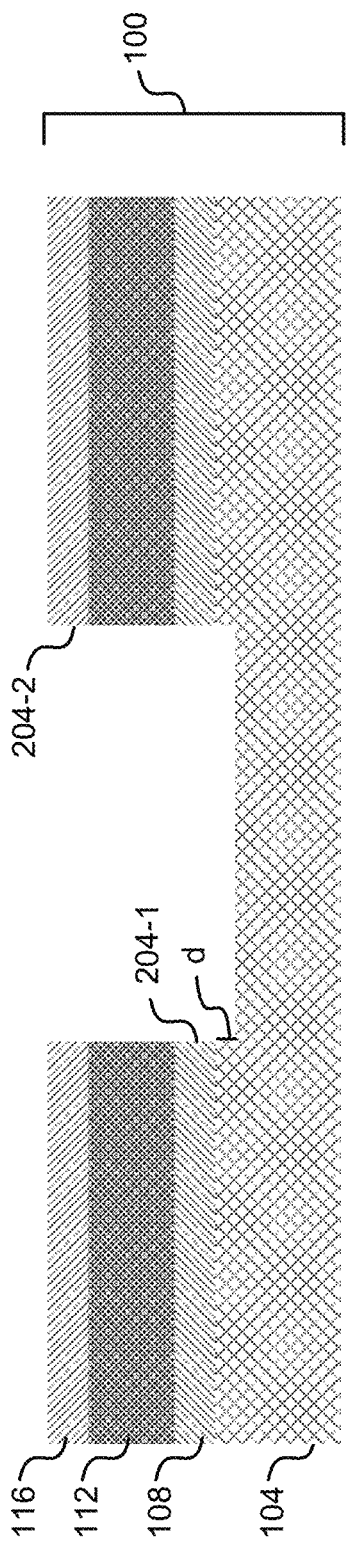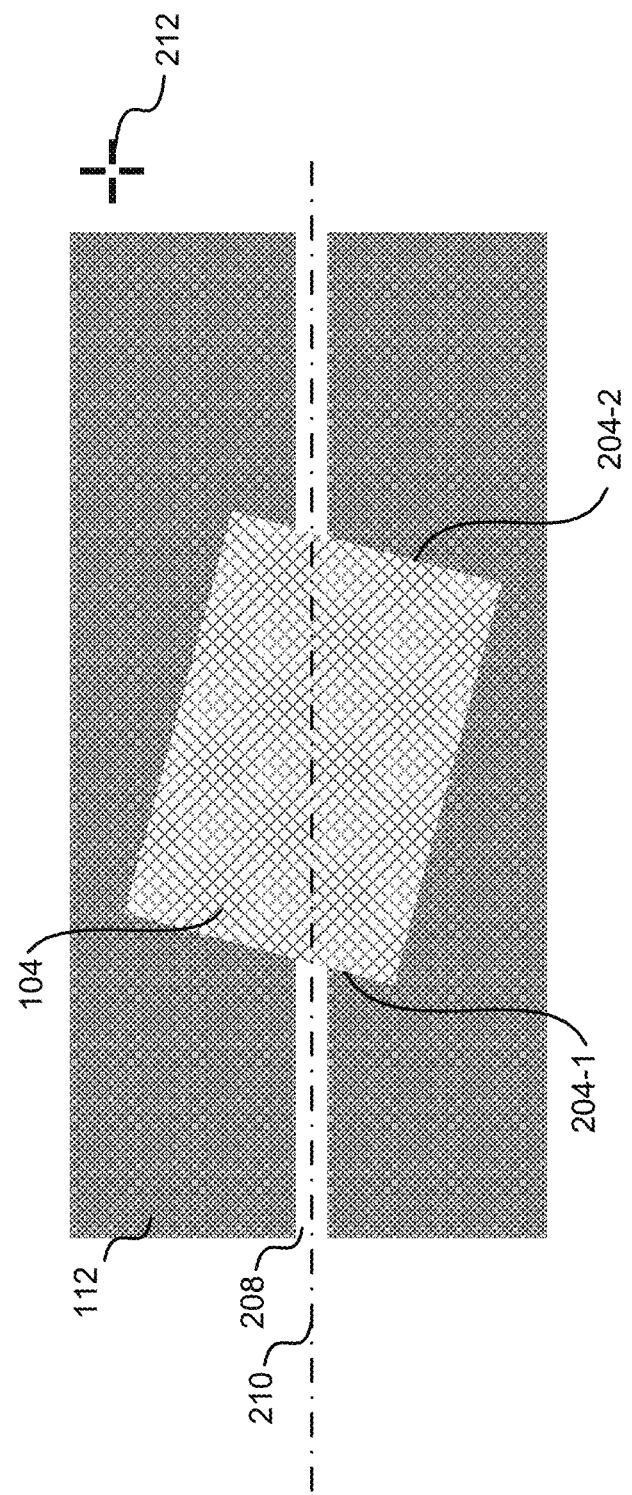

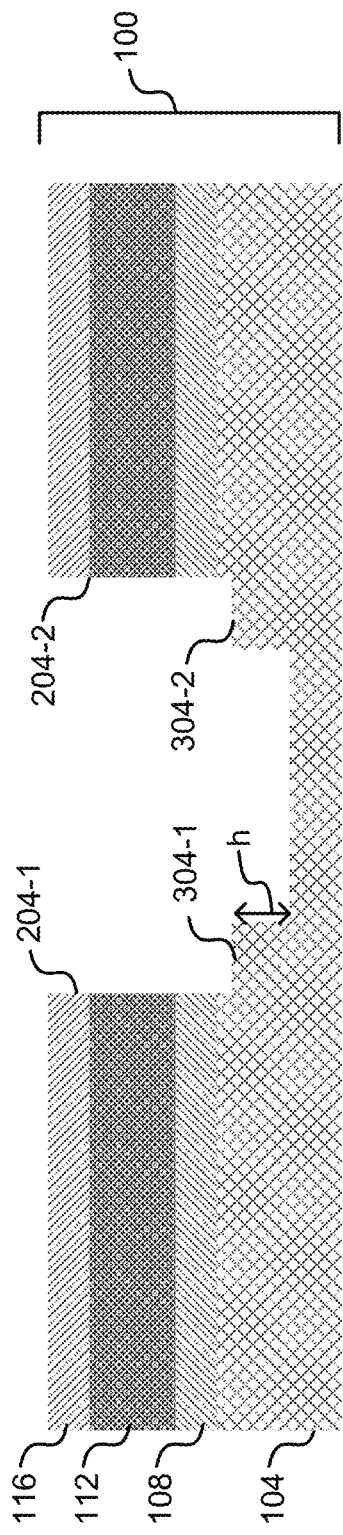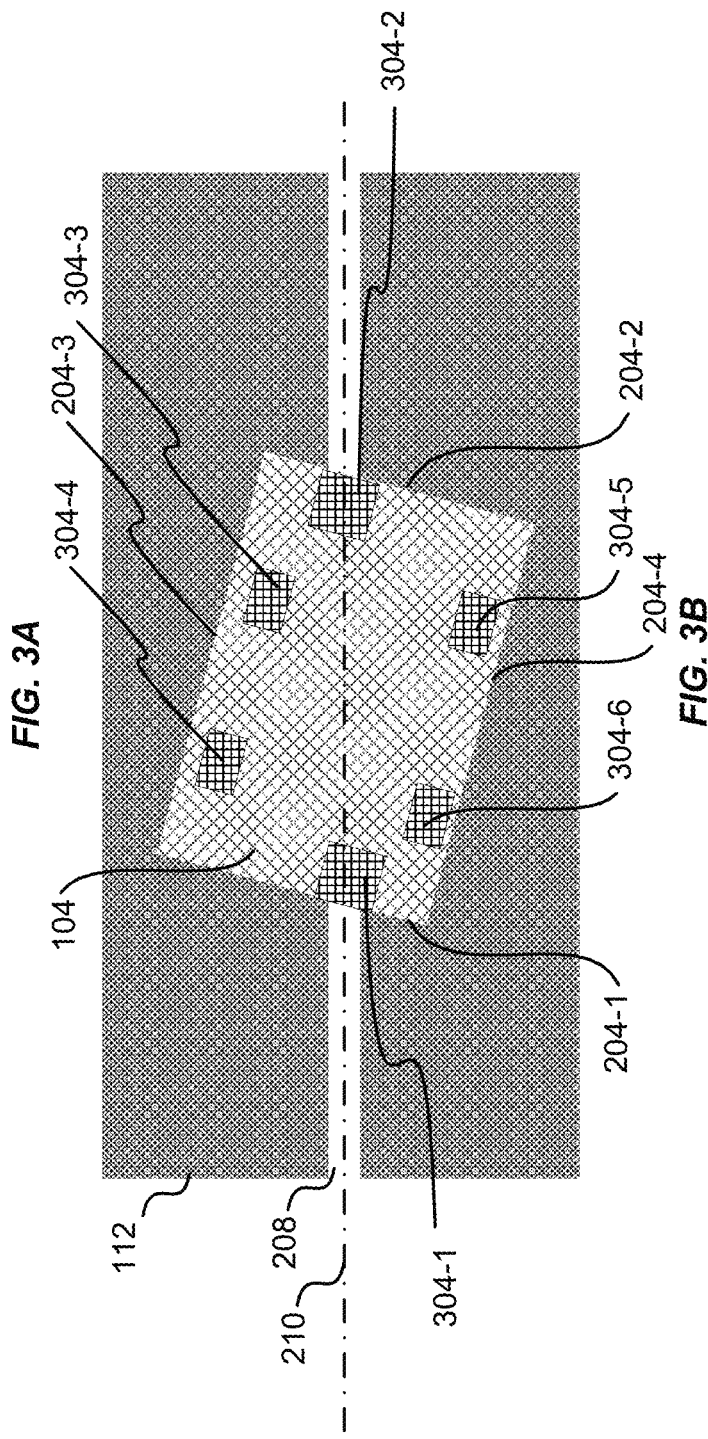

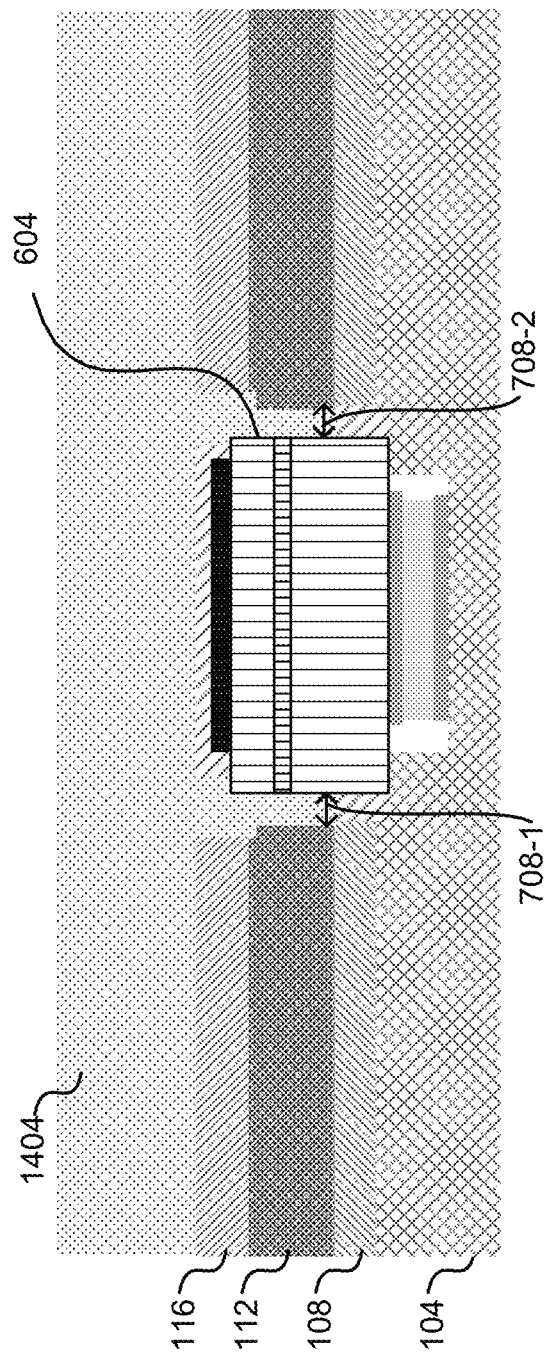
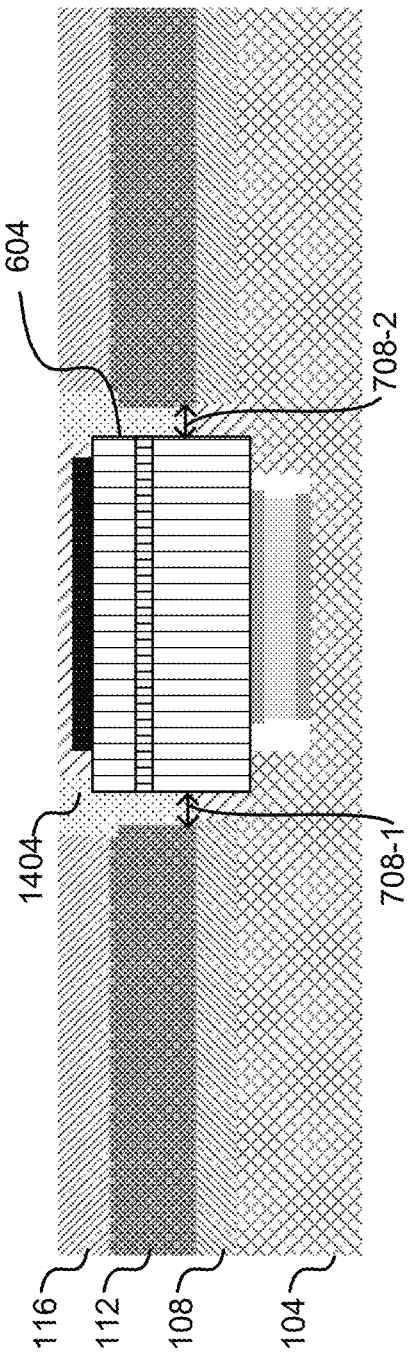
FIG. 14A
FIG. 14B

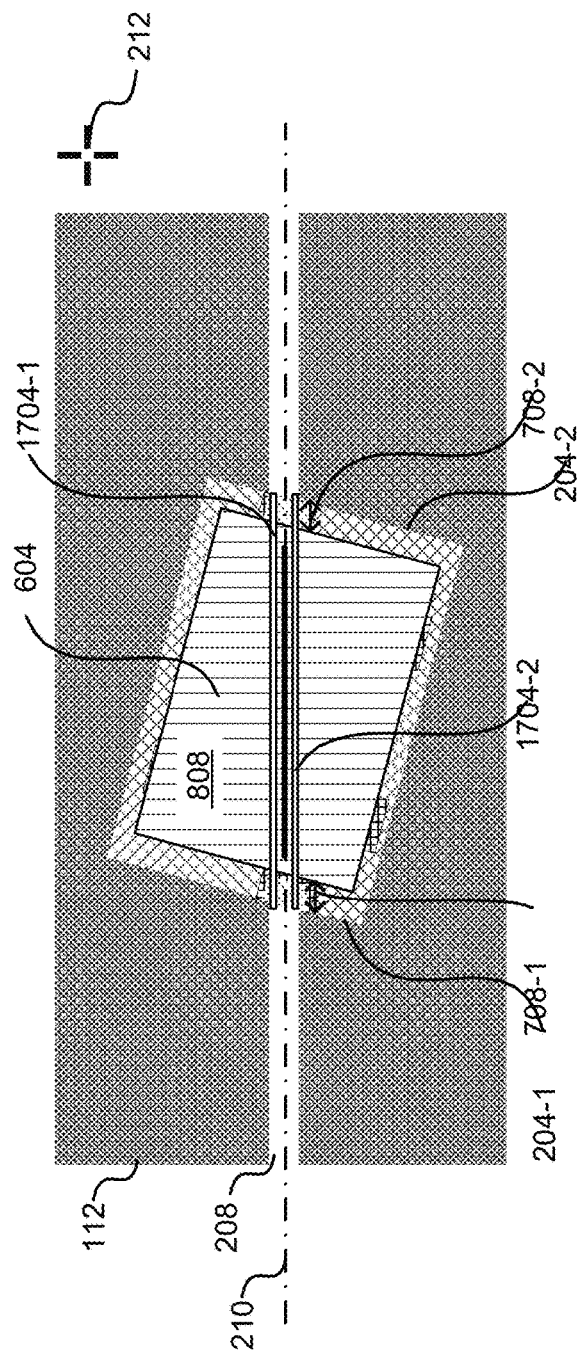
FIG. 17A
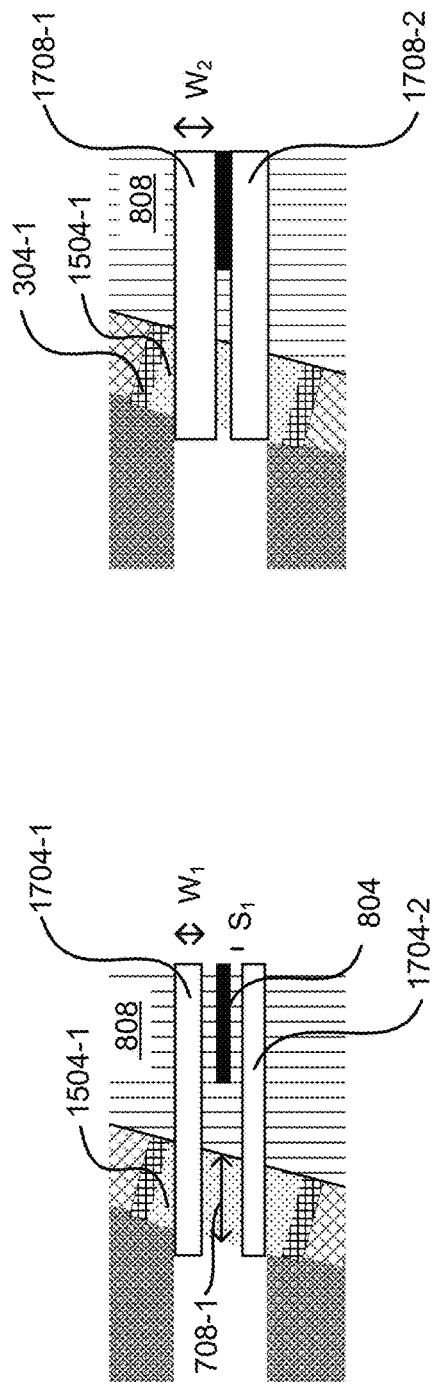
FIG. 17B
FIG. 17C

INTEGRATION OF AN UNPROCESSED, DIRECT-BANDGAP CHIP INTO A SILICON PHOTONIC DEVICE

CROSS-REFERENCES TO RELATED APPLICATIONS

This application is a continuation of U.S. patent application Ser. No. 15/073,957, filed on Mar. 18, 2016, entitled "Integration of an Unprocessed, Direct-Bandgap Chip Into a Silicon Photonic Device," which application is a continuation-in-part of U.S. patent application Ser. No. 14/509,914, filed on Oct. 8, 2014, entitled "Integration of an Unprocessed, Direct-Bandgap Chip Into a Silicon Photonic Device," now U.S. Pat. No. 9,316,785, issued on Apr. 19, 2016, which application claims priority to U.S. Provisional Application No. 62/028,611, filed on Jul. 24, 2014, entitled "Integration of an Unprocessed, Direct-Bandgap Chip Into a Silicon Photonic Device," and U.S. Provisional Application No. 61/888,863, filed on Oct. 9, 2013, entitled "Integrated Tunable CMOS Laser for Silicon Photonics."

U.S. patent application Ser. No. 15/073,957 is also a continuation-in-part of U.S. patent application Ser. No. 14/262,529, filed on Apr. 25, 2014, entitled "Method and System for Height Registration During Chip Bonding," now U.S. Pat. No. 9,324,682, issued on Apr. 26, 2016, which application claims priority to U.S. Provisional Application No. 61/815,938, filed on Apr. 25, 2013, entitled "Method and System for Height Registration During Chip Bonding."

U.S. patent application Ser. No. 15/073,957 is also a continuation-in-part of U.S. patent application Ser. No. 13/605,633, filed on Sep. 6, 2012, entitled "Tunable Hybrid Laser With Carrier-Induced Phase Control," now U.S. Pat. No. 9,318,868, issued on Apr. 19, 2016, which application claims priority to U.S. Provisional Application No. 61/532,050, filed on Sep. 7, 2011, entitled "Tunable Hybrid Laser With Carrier-Induced Phase Control."

U.S. patent application Ser. No. 15/073,957 is also a continuation-in-part of U.S. patent application Ser. No. 14/488,041, filed on Sep. 16, 2014, entitled "Method and System for Hybrid Integration of a Tunable Laser," which application is a continuation of U.S. patent application Ser. No. 13/040,181, filed on Mar. 3, 2011, entitled "Method and System for Hybrid Integration of a Tunable Laser for a Cable TV Transmitter," now U.S. Pat. No. 8,867,578, issued on Oct. 21, 2014, which application is a continuation-in-part of U.S. patent application Ser. No. 12/903,025, filed on Oct. 12, 2010, entitled "Method and System for Hybrid Integration of a Tunable Laser," now U.S. Pat. No. 8,615,025, issued on Dec. 24, 2013, which application claims priority to U.S. Provisional Patent Application No. 61/251,143, filed on Oct. 13, 2009, entitled "Hybrid Integrated Tunable Laser."

The disclosures of the applications listed above are incorporated by reference in their entirety for all purposes.

The disclosures of the following U.S. patents are also incorporated by reference into this application in their entirety for all purposes: U.S. Pat. No. 9,496,431, issued on Nov. 15, 2016; U.S. Pat. No. 9,923,105, issued on Mar. 20, 2018; and U.S. Pat. No. 9,882,073, issued on Jan. 30, 2018.

BACKGROUND OF THE INVENTION

Silicon integrated circuits ("ICs") have dominated the development of electronics and many technologies based upon silicon processing have been developed over the years. Their continued refinement led to nano-scale feature sizes that can be important for making metal oxide semiconductor CMOS circuits. On the other hand, silicon is not a direct-bandgap material. Although direct-bandgap materials, including III-V semiconductor materials, have been developed, there is a need in the art for improved methods and systems related to photonic ICs utilizing silicon substrates.

BRIEF SUMMARY OF THE INVENTION

Embodiments of the present invention provide devices, systems, and methods of a composite device, such combining functionality of two different semiconductor materials to create an optical device.

In some embodiments, a composite device for splitting photonic functions across two or more materials comprising a platform, a chip, a bond, and a coating is disclosed. The platform comprises a base layer and a device layer, the device layer comprising a first material and a plurality of walls forming an opening in the device layer such that a portion of the base layer of the platform is exposed through the device layer. In some embodiments, the first material is silicon. The chip comprises a second material and an active region in the second material. In some embodiments, the second material is a III-V material. The bond secures the chip to the platform such that the active region of the chip is aligned with the device layer. A coating hermitically seals the chip in the platform.

In some embodiments, a method of fabricating a composite device for splitting photonic functions between two or more materials is disclosed. A first mask is aligned with a target. A recess is etched in a platform based on the first mask aligned with the target. A chip is bonded in the recess of the platform, wherein a gap separates a side of the chip and a wall of the recess. A contact metal is applied to the top of the chip. The gap is filled with a first material. In some embodiments, the first material is silicon dioxide. A second mask is applied to define an area to etch over the gap. The first material is partially removed from the gap. The gap is at least partially filled with a second material. In some embodiments, the second material is poly-silicon. The second material is partially removed from the gap. In some embodiments, partially removing the second material from the gap forms part of a ridge waveguide in the second material. A third mask is applied to define an area to remove from the chip to form a feature on the chip. Material from the chip is removed to form the feature on the chip. In some embodiments, the third mask is a photo mask and the third material is used to create an etch mask based on the photo mask. Material from the chip is removed to form a feature on the chip. A fourth material is used to cover the chip. In some embodiments, the chip comprises an active region (e.g., for a laser or a modulator) and the platform is made of silicon. In some embodiments, pedestals are used for aligning the chip with the platform. In some embodiments, the pedestals used for aligning the chip are etched in the platform. In some embodiments, the fourth material hermitically seals the chip in the recess of the platform. In some embodiments, the fourth material is SiO2. In some embodiments, under-bump metallization with indium is used in bonding the chip to the platform. In some embodiments, a contact metal is added on the chip on a surface exposed by removing a portion of the chip. In some embodiments, two or more ohmic contacts are added to the chip after the fourth material is applied. In some embodiments, the third material is the same as the fourth material. In some embodiments, masks used before etching the second material in the gap and/or the chip are aligned using the target.

In some embodiments, a method for coplanar integration of a direct-bandgap chip into a silicon device is disclosed. A platform is provided, the platform having a base layer, a device layer above the base layer, where in the device layer comprises a plurality of walls forming an opening in the device layer such that a portion of the base layer of the platform is exposed through the device layer. The chip is provided, the chip having a substrate and an active region. The chip is bonded to the portion of the base layer of the platform. In some embodiments, the substrate of the chip extends above the platform out of the recess and at least a portion of the substrate of the chip is removed so that the chip does not extend above the platform.

In some embodiments, another method for coplanar integration of a direct-bandgap chip into a silicon device is disclosed. A platform is provided, wherein the platform has a recess and the platform comprises a first material. A chip is provided, wherein the chip comprises a second material and a portion of a substrate. The chip is bonded in the recess of the platform to the platform. And the portion of the substrate is removed from the chip after the chip is bonded to the platform.

In some embodiments, a method for processing of a direct-bandgap chip after bonding to a silicon photonic device is disclosed. A composite device having a platform and a chip is provided. The platform has a recess and the chip is bonded in the recess. The composite device is masked to define an area of the chip to etch. The area of the chip to etch is etched after the chip has been bonded to the platform (thus etching the chip while the chip is bonded in the recess of the platform). In some embodiments, a waveguide is etched on the chip while the chip is bonded to the platform.

In some embodiments, another method for processing of a direct-bandgap chip after bonding to a silicon photonic device is disclosed. A first mask is aligned with a target to define an etch area on a platform. A recess is etched in the platform defined by the etch area. A chip is bonded in the recess of the platform. A second mask is aligned with the target to define a feature area on the chip. The chip is processed (e.g., etched) to form the feature on the chip.

In some embodiments, a device having a contact layer dam is disclosed. The contact layer dam is used in creating a composite device. The device having a contact layer comprises a platform, a chip, and the contact layer, wherein the chip is bonded in a recess of the platform. The contact layer comprises a first indentation on a first side of the contact layer; the first indentation comprises a first portion and a second portion; the first portion of the first indentation is wider than the second portion of the first indentation; the first portion of the first indentation is closer to a center of the contact layer than the second portion of the first indentation; the contact layer comprises a second indentation on a second side of the contact layer; the second indentation comprises a first portion and a second portion; the first portion of the second indentation is wider than the second portion of the second indentation; and the first portion of the second indentation is closer to the center of the contact layer than the second portion of the second indentation.

In some embodiments, a photonic device having pedestals is disclosed. The photonic device comprises a base layer, a device layer, a first pedestal, and a second pedestal. A contact layer dam is disclosed. The contact layer dam is used in creating a composite device. The device layer is above the base layer; the device layer comprises a plurality of walls forming an opening in the device layer such that a portion of the base layer is exposed through device layer and forms a recess in the photonic device. The device layer comprises a waveguide extending along portions of an optical path; the waveguide has a first termination at a first wall of the plurality of walls at one side of the recess; the waveguide has a second termination at a second wall of the plurality of walls at another side of the recess. The first pedestal extends from a floor of the base layer in a direction normal to the floor toward the device layer; and the first pedestal is under the optical path and closer to the first wall than the second wall. The second pedestal extends from the floor of the base layer in the direction normal to the floor toward the device layer; and the second pedestal is under the optical path and closer to the second wall than the first wall.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

FIGS. 2A and 2B are simplified views of an embodiment of an opening formed in the platform.

FIGS. 3A, 3B, and 3C are simplified views of an embodiment of pedestals formed in the opening of the platform.

FIG. 14A is a simplified cross-sectional, side view of an embodiment of the composite device having a second material deposited on the composite device.

FIG. 14B is a simplified cross-sectional, side view of an embodiment of the composite device with excess second material removed.

FIGS. 17A-17C are simplified top views of layers of an embodiment for forming a waveguide on the chip.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The ensuing description provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

Embodiments relate generally to a platform bonded to a chip to form a composite device. For example, a platform (e.g., a silicon platform) can be bonded to a semiconductor of different material (e.g., III-V). Though making devices with silicon has some advantages (e.g., cost and developed fabrication methods), silicon is not a direct-bandgap material. In certain applications, it is desirable to have a direct-bandgap material (e.g., for a laser gain medium). Thus, a chip made of a semiconductor material having a direct bandgap is integrated with a silicon platform.

Figure 1A:
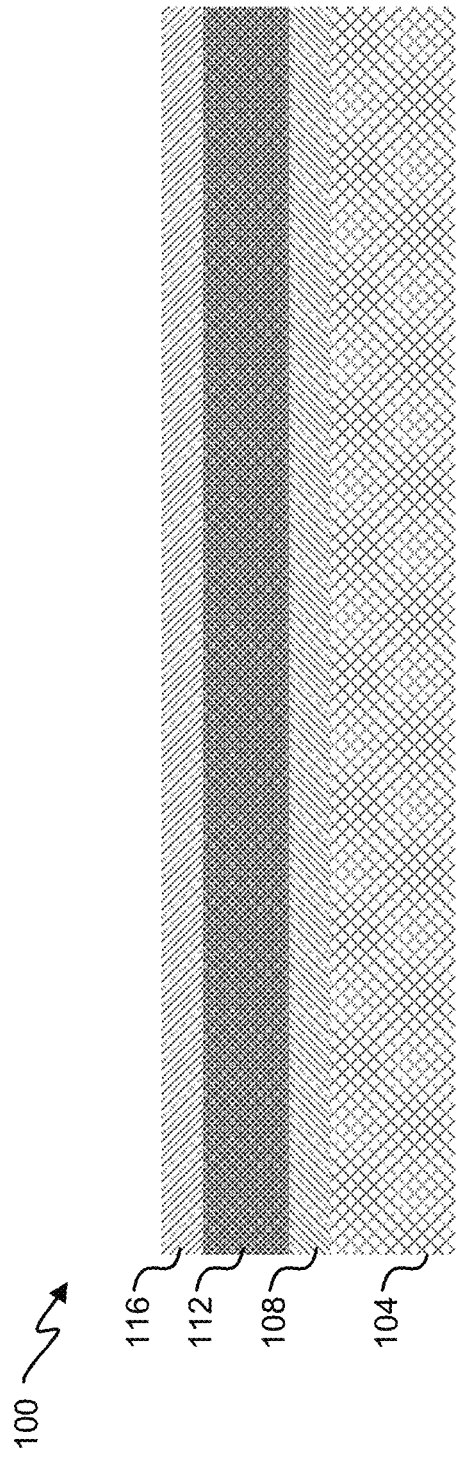
FIGS. 1A and 1B are simplified cross-sectional, side views of an embodiment of a platform.
Figure 1B:
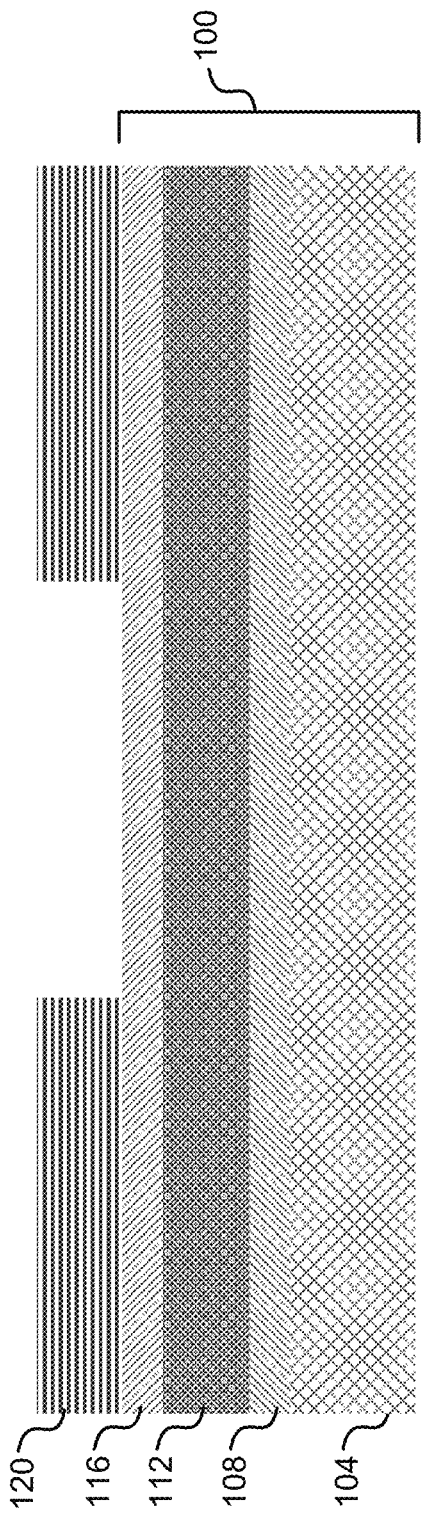

In FIGS. 1A and 1B simplified cross-sectional, side views of an embodiment of a platform are shown. In FIG. 1A, a platform 100 is shown. The platform 100 comprises a base layer 104, a lower layer 108 on top of the base layer 104, a device layer 112 on top of the lower layer 108, and an upper layer 116 on top of the device layer 112. The device layer 112 is made of a first semiconductor material. For example, in some embodiments, the base layer 104 is a crystalline silicon substrate; the lower layer 108 is an oxide layer (e.g., SiO2); the device layer 112 is made of crystalline silicon; and the upper layer 116 is an oxide layer (e.g., SiO2). In some embodiments, the base layer 104, the lower layer 108, and the device layer 112 started as a silicon on insulator (SOI) wafer (e.g., the base layer 104 is a handle and the lower layer 108 is a BOX (Buried Oxide) layer). In this embodiment, the device layer 112 has been processed (e.g., waveguides, mirror, gratings have been formed in the device layer 112) and the upper layer 116 is placed on top of the device layer 112 to create the platform 100. In some embodiments the device layer 112 comprises a core of a waveguide, and the lower layer 108 and the upper layer 116 act as cladding material for the waveguide (the device layer 112 having a higher index of refraction than the lower layer 108 and the upper layer 116).

In FIG. 1B, a photoresist layer 120 is added on top of the upper layer 116 of the platform 100. The photoresist layer 120 partially covers the upper layer 116, leaving an area of the upper layer 116 exposed. In some embodiments, the area of the upper layer 116 exposed by the photoresist layer 120 is rectangular, but other shapes can be used.

Referring next to FIGS. 2A and 2B, simplified views of an embodiment of an opening formed in the platform 100 are shown. In FIG. 2A, a simplified side view of the platform 100 is shown. The platform 100 has been etched to form an opening. The opening forms a first wall 204-1, where the first wall 204-1 extends vertically from the base layer 108 to the upper layer 116. The opening forms a second wall 204-2, where the second wall 204-2 extends vertically from the base layer 108 to the upper layer 116. In some embodiments, the base layer 104 is also etched to a depth d. In some embodiments, d ranges from 10-150 nm (e.g., 70, 80, 90, or 100 nm). In some embodiments, the depth d is an over-etch used to ensure etching through the lower layer 108. In some embodiments, the opening was formed by a dry etch.

In FIG. 2B, a simplified top view of an embodiment of the first substrate is shown. FIG. 2B is not a true top view of what would be seen, but instead shows layers that might otherwise be hidden to better show this embodiment. The top view in FIG. 2B shows a device layer 112 and a waveguide 208 in the device layer 112. In some embodiments, before the platform 100 is etched, the waveguide 208 is continuous (i.e., extending from left to right in FIG. 3B). But etching the platform 100 to form the opening removes a segment of the waveguide (i.e., because a portion of the device layer 112 is etched). An optical path 210 of the waveguide 208 is shown traversing the platform 100 from left to right, including traversing the opening where the segment of the waveguide has been removed. In some embodiments, the waveguide 208 was not continuous before etching the opening. The opening exposes a rectangular portion of the base layer 104. The waveguide 208 terminates along the optical path 210 at the first wall 204-1. The waveguide terminates along the optical path 210 at the second wall 204-2. The first wall 204-1 is at an angle with respect to the waveguide 208 (an angle between the optical path 210 and a vector normal to the first wall 204-1) to reduce reflections along the optical path 210. A target 212 is used in aligning one or more masks for processing the platform 100. The target 212 is a symbol or identifiable feature.

Figure 3C:
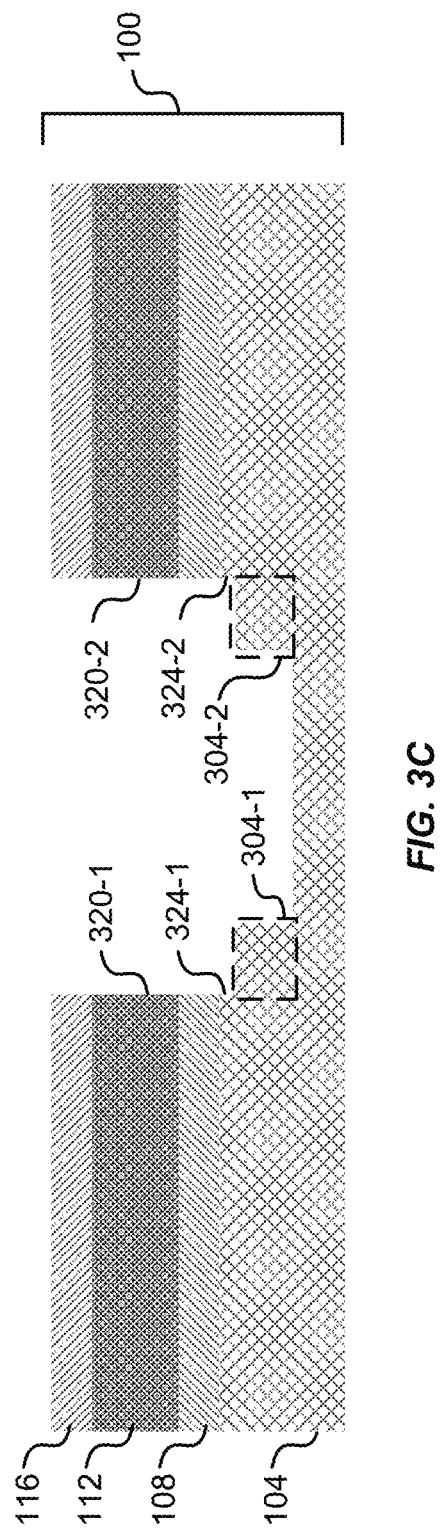

In FIGS. 3A, 3B and 3C simplified views of an embodiment of pedestals formed in the opening of the platform 100 are shown. In FIG. 3A, a simplified side view of the platform 100 depicts the platform 100 after the platform 100 is further etched to form pedestals 304 that have a height h in the base layer 104 with respect to a floor in the base layer 104, wherein the floor is a lowest etched portion of the opening. In some embodiments, h is between 200 and 800 nm (e.g., 400, 420, 430, 450, 500, or 520 nm). Thus pedestals 304 extend from the base layer 104 in a direction normal to the base layer 104 and towards the device layer 112. A first pedestal 304-1 is located next to the first wall 204-1. A second pedestal 304-2 is located next to the second wall 204-2.

In FIG. 3B, a simplified top view of an embodiment of the platform from the device layer 112 is shown. FIG. 3B is not a true top view of what would be seen, but instead shows layers that might otherwise be hidden to better show this embodiment. In the device layer 112 is a waveguide 208. Pedestals 304 are shown in the opening. In this disclosure, empty volume created by the opening and/or formation of pedestals in the platform 100 is referred to as a recess. The first wall 204-1 and the second wall 204-2 form two sides of the recess. A third wall 204-3 and a fourth wall 204-4 form two other sides of the recess. In this embodiment, there are six pedestals 304; the first pedestal 304-1, the second pedestal 304-2, a third pedestal 304-3, a fourth pedestal 304-4, a fifth pedestal 304-5, and a sixth pedestal 304-6.

In some embodiments, the first pedestal 304-1 is placed next to the first wall 204-1, in line with the waveguide 208 to prevent bonding material from interfering with the waveguide 208. Similarly, in some embodiments, the second pedestal 304-2 is placed near the second wall 204-2 to prevent bonding material from interfering with the waveguide 208. In some embodiments, there is no space in the base layer 104 between the first pedestal 304-1 and the first wall 204-1. Similarly, in some embodiments, there is not space in the base layer 104 between the second pedestal 304-2 and the second wall 204-2.

The third pedestal 304-3 and the fourth pedestal 304-4 are placed near the third wall 204-3. The fifth pedestal 304-5 in the sixth pedestal 304-6 are placed near the fourth wall 204-4. In some embodiments, there is a space in the base layer 104 between the third pedestal 304-3 and the third wall 204-3. Similarly, other pedestals 304, which are not near the waveguide 208, are spaced a distance from the walls 304. In some embodiments, pedestals 304 are not placed under the optical path 210, besides the first pedestal 304-1 and the second pedestal 304-2. A chip with a gain medium is to be placed in the recess. If a pedestal 304 is placed under the optical path 210, then electrical contact with the chip under the optical path can be reduced, thus changing how current flows through the chip 207 and degrading how the gain medium performs. Though the optical path 210 in the embodiment in FIG. 3B is a straight line, other path geometries (e.g., involving bends) can be used (e.g., to increase a path length over the gain medium).

In FIG. 3C, a plurality of walls 320 of the device layer 112 and a plurality of walls 324 of the base layer 104 are shown. A first wall 320-1 of the plurality of walls 320 of the device layer 112 and a second wall 320-2 of the plurality of walls 320 of the device layer 112 are shown. A first wall 324-1 of the plurality of walls 324 of the base layer 104 and a second wall 324-2 of the plurality of walls 324 of the base layer 104 are shown. The first wall 324-1 of the base layer 104 is coplanar with the first wall 320-1 of the device layer 112 because both the first wall 324-1 of the base layer 104 and the first wall 320-1 of the device layer 112 are part of the first wall 204-1 of the opening. Likewise, the second wall 324-2 of the base layer 104 is coplanar with the second wall 320-2 of the device layer 112 because both the second wall 324-2 of the base layer 104 and the second wall 320-2 of the device layer 112 are part of the second wall 204-2 of the opening.

The first pedestal 304-1 is contiguous (i.e., not free standing) with the first wall 324-1 of the base layer 104. And the second the second pedestal 304-2 is contiguous with the second wall 324-2 of the base layer 104. In some embodiments, the first pedestal 304-1 is contiguous with the first wall 324-1 of the base layer 104 to help prevent bonding material from intruding into an optical path between an active region of a chip and the device layer 112. Likewise, in some embodiments, the second pedestal 304-2 is contiguous with the second wall 324-2 of the base layer 104 to help prevent bonding material from intruding into an optical path between an active region of the chip and the device layer 112.

Figure 4:
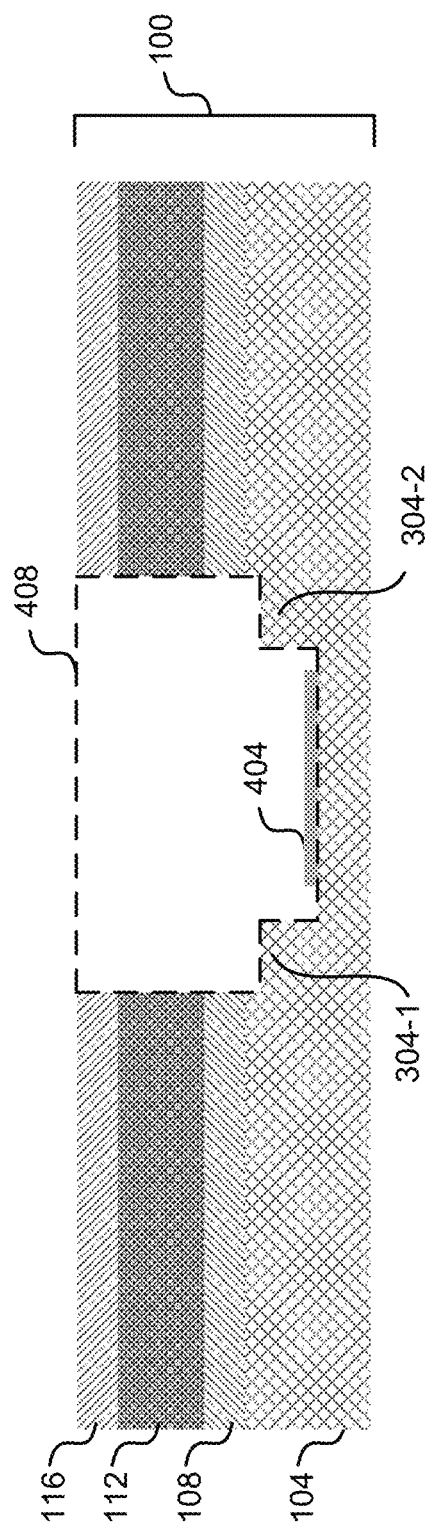
FIGS. 4 and 5 are simplified views of an embodiment of a contact layer positioned on a floor of a recess formed in the platform.
Figure 5:
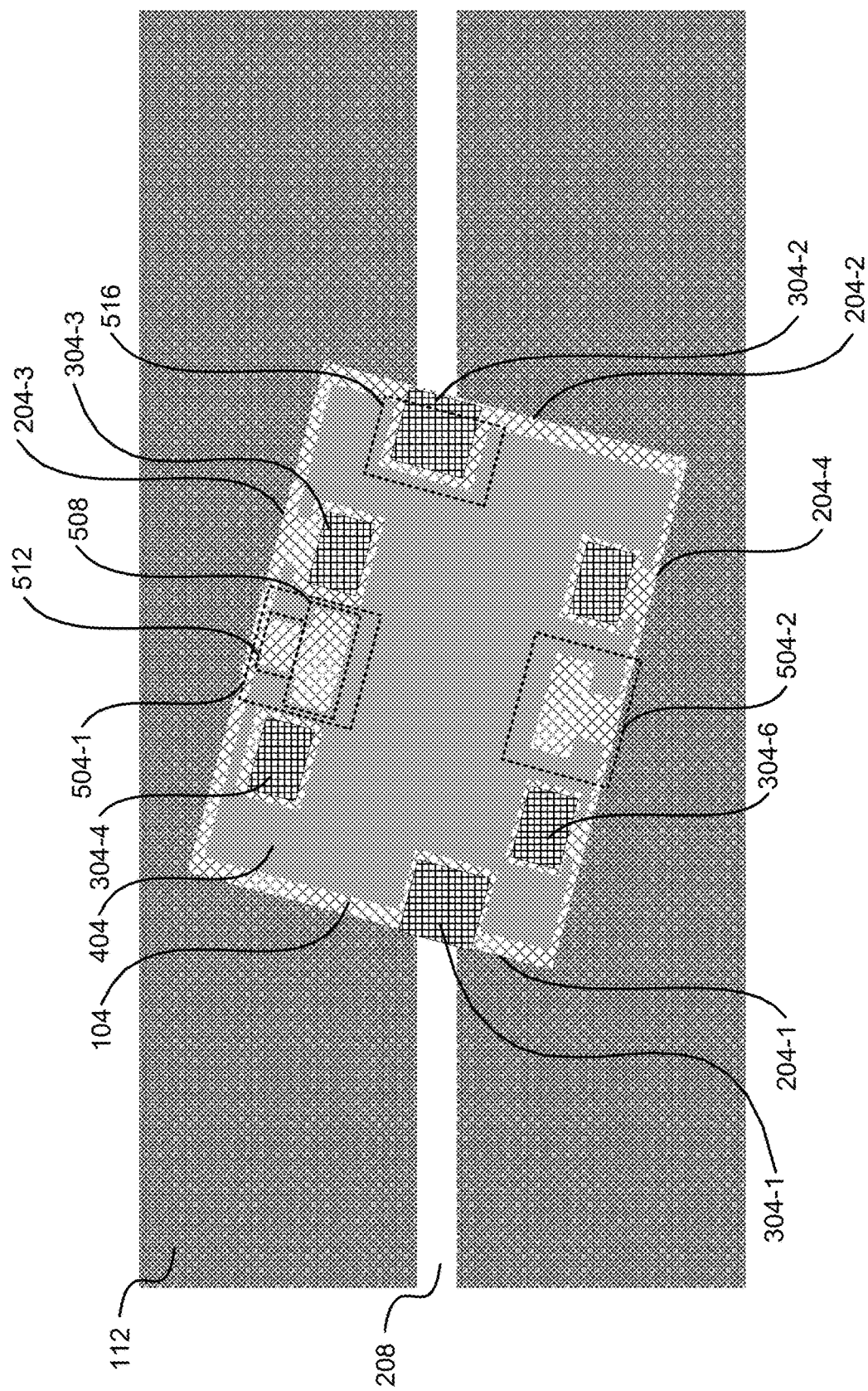

In FIGS. 4 and 5, simplified views of an embodiment of a contact layer 404 positioned on the floor of the recess formed in the platform 100 are shown. In some embodiments, the contact layer 404 is a metal used in under-bump metallization (UBM). In some embodiments, the contact layer 404 includes an adhesion metal such as titanium and/or chromium and a barrier metal such as platinum and/or nickel. In some embodiments, contact layer 404 comprises tungsten and/or other refractory metals used as barrier layers in silicon-based devices. FIG. 4 is a simplified side view of a cross section of the platform 100. FIG. 4 shows the contact layer 404 located on the floor of the recess 408 between the first pedestal 304-1 and the second pedestal 304-2.

FIG. 5 shows a simplified top view of the platform 100 from the device layer 112. The contact layer 404 is placed on top of the floor of the recess 408 (covering portions of the base layer 104). The contact layer 404 comprises a first indentation 504-1 and a second indentation 504-2. The first indention is on one side of the recess 408 (closest to the third wall 204-3). The second indentation is on another side of the recess 408 (closest to the fourth wall 204-4). The first indention 504-1 comprises a first portion 508 and a second portion 512. The first portion 508 is rectangular in shape and contiguous with the second portion 512. The second portion 512 is rectangular in shape. But in other embodiments, other shapes are used. For example, the first portion 508 could be a triangle with an edge to a center of the contact layer 404 and a point toward a wall 204 of the recess 408.

The first portion 508 is closer to the center of the contact layer 404 than the second portion 512. The first portion 508 is wider than the second portion 512. In some embodiments, an indentation 504 is used to help control solder flow during UBM bonding. Solder flows more freely over the contact layer 404 than the base layer 104 when the solder is heated. Thus the indentations 504 act as dams to hold the solder back during bonding, allowing a more even distribution of the solder on the contact layer 404 and under the optical path 210.

Similar to the first indentation 504-1, the second indentation 504-2 also has a first portion and a second portion. The first portion of the second indentation 504-2 is wider and closer to the center of the contact layer 404 than the second portion of the second indentation 504-2. In some embodiments, the indentations 504 are wider near the center of the contact layer 404 to allow a greater surface area of the contact layer 404 near walls 204 of the recess 408. In some embodiments, electrical contacts are made to the contact layer 404 by ohmic contacts placed along the third wall 204-3 and the fourth wall 204-4. Having an increased surface area of the contact layer 404 near the third wall 204-3 and the fourth wall 204-4 can help increase current flow through the electrical contacts.

In some embodiments, indentations 504 are placed between pedestals. Indentations can also be used around pedestals (e.g., a pedestal being within a first portion of an indentation). The contact layer 404 can also have reentrants 516 formed around two or three sides of a pedestal. For example, reentrant 516 is shown going around three sides of the second pedestal 304-2.

FIG. 5 further shows the contact layer 404 around three sides, and partially a fourth side, of the third pedestal 304-3. Thus, in some embodiments, bonding material flows around three sides, a partially a fourth side, of the third pedestal 304-3. In some embodiments, flowing bonding material at least partially around the fourth side of the third pedestal 304-3 can help strengthen bonding between the platform 100 and a chip and/or provide more surface area for bonding material to flow to help reduce a vertical flow (i.e., out of the recess) of the bonding material. In some embodiments, the contact layer 404 surrounds four sides of a pedestal 304. For example, FIG. 5 shows the contact layer 404 around four sides of the fourth pedestal 304-4.

Figure 6:
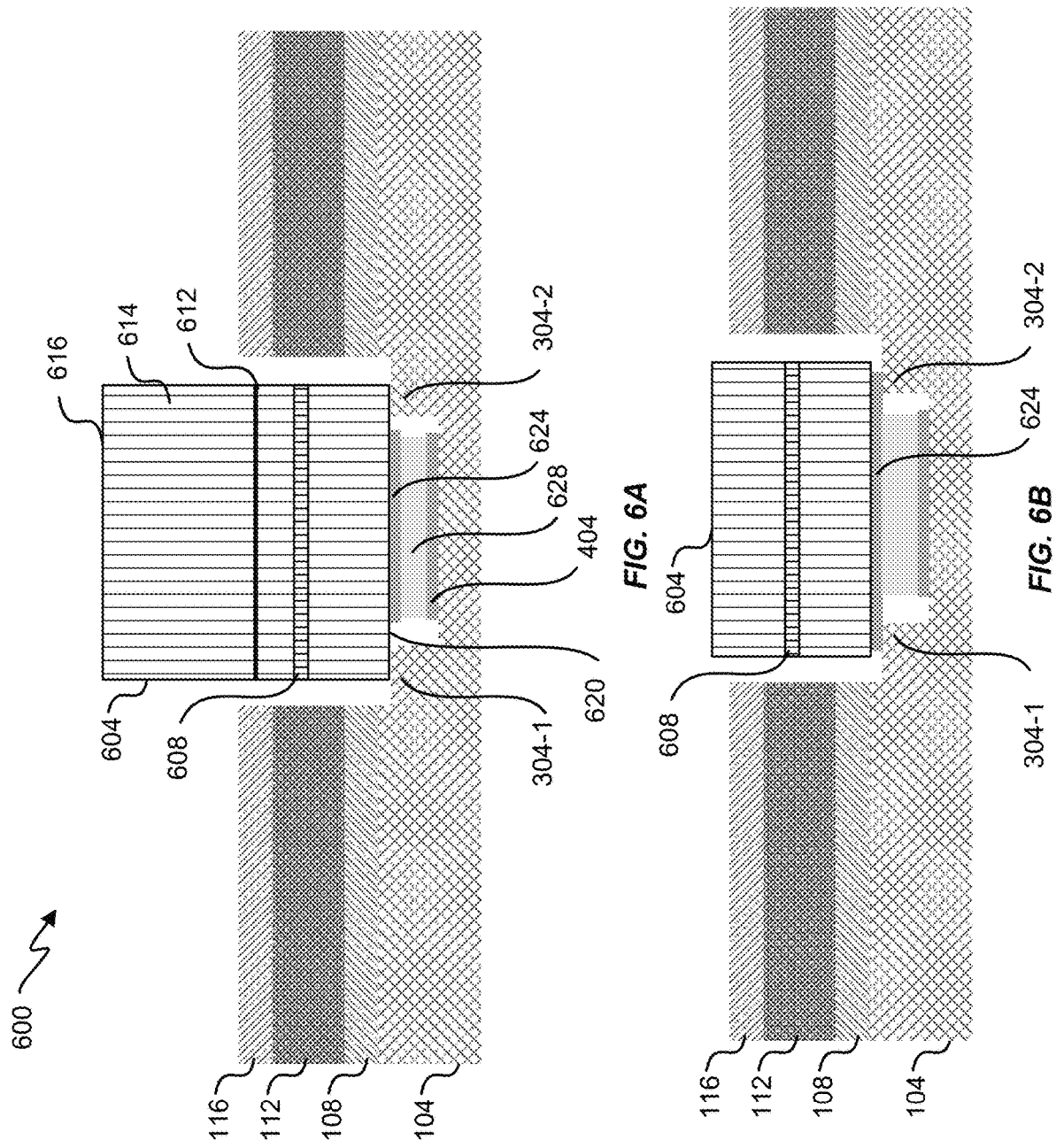
FIGS. 6A and 6B are simplified cross-sectional, side views of embodiments of a chip bonded in the recess of the platform to form a composite device.

Referring next to FIGS. 6A and 6B, simplified cross-sectional, side views of embodiments of a chip bonded in the recess 408 of the platform 100 to form a composite device are shown. FIGS. 6A and 6B are similar to FIG. 4 with the addition of a chip 604 and bonding material. The chip 604 comprises a second material (e.g., metal and/or semiconductor material). In some embodiments, the chip 604 is made of III-V material (e.g., InP, GaN, GaP, GaAsP, AlGaP, or AlGaInP), and/or other direct-bandgap material. In some embodiments, the III-V material comprises a compound or an alloy. Examples of a compound include GaAs and InP. An example of an alloy is $In_xGa_{1-x}As_yP_{1-y}$, wherein there is a stoichiometric relationship between group III materials and group V materials, but not necessarily a fixed relationship between species within a group (e.g., bandgap and lattice constants can be varied to form desired multiple quantum wells). FIG. 6A shows the chip 604 having an active region 608, an etch stop 612, and a portion of a substrate 614. In some embodiments, the active region 608 is a series of quantum wells used as a gain medium for a laser. In some embodiments, the chip 604 is made of InP and the etch stop is made of some other material, such as a III-V binary, ternary, or quaternary composition other than InP (e.g., AlGaP, GaN). In some embodiments, the etch stop is less than 2000, 1000, 500, or 200 Å in thickness.

A vertical position of the chip 604 is aligned to the platform 100 using the pedestals 304. In FIG. 6A, the chip 604 rests on the first pedestal 304-1 and the second pedestal 304-2 (as well as the third pedestal 304-3, the fourth pedestal 304-4, the fifth pedestal 304-5, and the sixth pedestal 304-6 as shown in FIG. 5). The chip 604 has a bottom surface 616 and a top surface 620. The active region 608 was grown on at least a portion of the substrate 614 of the chip 604. On the top surface 620 is a chip contact 624. The chip contact 624 is a metal layer. In some embodiments, the chip contact 624 is made of similar material as the contact layer 404 on the platform 100. For example, in some embodiments, the chip contact 624 is a metal used in under-bump metallization (UBM). In some embodiments, the chip contact 624 includes an adhesion metal such at titanium and/or chromium and a barrier metal such as platinum and/or nickel. The chip 604 is turned "upside down" and placed in the recess 408 of the platform 100 such that the chip contact 624 on the top surface 620 of the chip 604 is bonded to the contact layer 404 at the floor of the recess 408. Thus the chip 604 is bonded to the base layer 104 (e.g., the handle of an SOI wafer) of the platform 100. In FIG. 6A, the chip contact 624 is positioned on the top surface 620 of the chip 604 so that the chip contact 624 does not contact top surfaces of pedestals 304; thus the top surface 620 of the chip 604 rests directly on the pedestals 304.

The bottom surface 616 of the chip 604 extends out of the recess 408 above the platform 100. The etch stop 612 is positioned to be within the recess 408 of the platform 100.

The chip 604 is bonded to the platform 100 using bonding material 628. In some embodiments, the bonding material 628 is a metal. In some embodiments, the bonding material 628 is $In_xPd_y$, for example, $In_{0.7}Pd_{0.3}$, which is an alloy that is stable up to very high temperatures. $In_{0.7}Pd_{0.3}$ forms an ohmic contact with both silicon and/or III-V materials, for which doping types at either side can be either p-type or n-type. Thus, in some embodiments of the present invention, the bonding material 628 provides ohmic contact between materials on both sides of the intermediate layer, adhesion, optical quality including transparency (i.e., low optical loss), stress accommodation, and other benefits. Other suitable alloys include germanium palladium, gold/germanium, Au/Sn, Al/Mg, Au/Si, palladium, indium/tin/silver alloys, metal alloys containing Bi, Sn, Zn, Pb, or In, combinations thereof, or the like. In some embodiments, the bonding material 628 has eutectic or peritectic points, and allows a bonding process temperature less than 540° C. (e.g., in the 350° C. to 500° C. range).

FIG. 6B shows another embodiment of bonding the chip 604 to the platform 100. FIG. 6B is similar to FIG. 6A, except the chip contact 624 is placed on the chip 604 such that the chip contact 624 rests on the pedestals 304. In both FIG. 3A and FIG. 3B, the pedestals 304 are used to align the active region 608 of the chip 604 with the device layer 112 because a height difference between the pedestals 304 and the device layer 112 is known; a height difference between the top surface 620 of the chip 604 and the active region 608 is known; and, in the embodiment in FIG. 6B, a thickness of the chip contact 624 is known.

Figure 7:
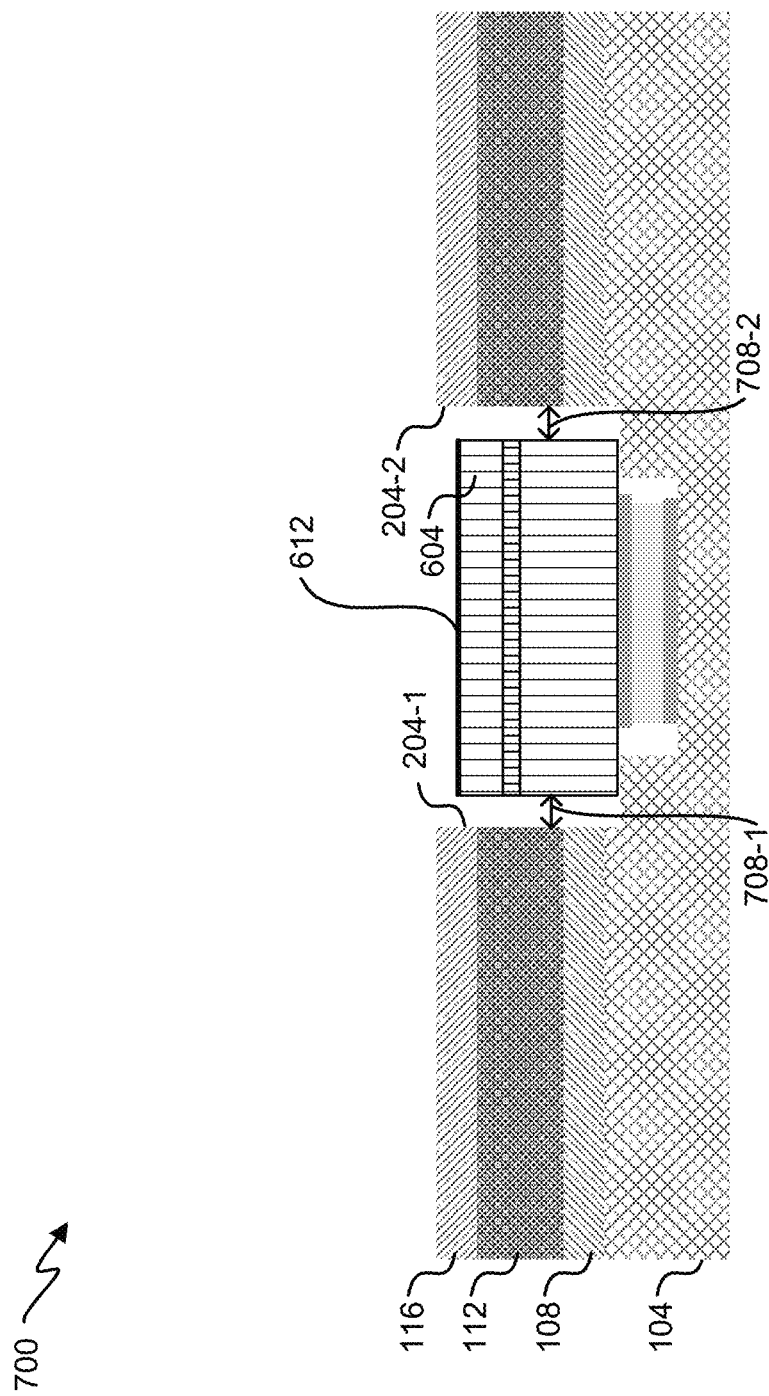
FIG. 7 is a simplified cross-sectional, side view of an embodiment of the composite device after a substrate of the chip is removed.

FIG. 7 is a simplified cross-sectional, side view of an embodiment of the composite device after a substrate 614 of the chip is removed. In some embodiments, the composite device is masked and etched. In some embodiments, the target 212 that is used to align a mask for etching the platform 100 to form the recess 408 and/or pedestals 304 is also used to align a mask for etching the chip to remove the substrate 614 of the chip. In some embodiments, the chip 604 does not extend out of the recess 408 above the platform 100 after the substrate 614 of the chip 604 is removed. A first gap 708-1 is formed between a side of the chip 604 and the first wall 204-1. A second gap 708-2 is formed between another side of the chip 604 and the second wall 204-2.

Figure 8:
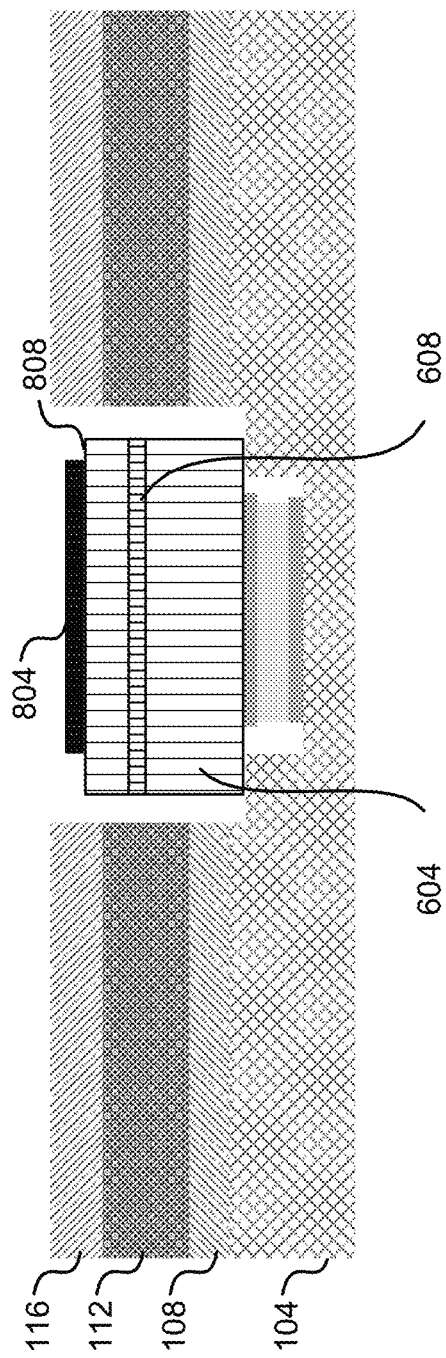
FIG. 8 is a simplified cross-sectional, side view of an embodiment of the composite device after a contact metal is placed on the chip.

FIG. 8 is a simplified cross-sectional, side view of an embodiment of the composite device after a contact metal 804 is placed on the chip 604. The contact metal 804 is placed on a chip surface 808 in a strip above and parallel to the optical path 210. The contact metal 804 is for applying a current and/or a voltage to the active region 608 of the chip 604. For example, in some embodiments, if the active region 608 of the chip 604 is used for a modulator, then a reverse bias is applied and, ideally, no current flows; but if the active region 608 of the chip 604 is used for a gain medium, then current is applied. In some embodiments, a mask is used for placing the contact metal 804 on the chip surface 808. In some embodiments, the target 212 is used to align the mask used for placing the contact metal 804 on the chip surface 808.

Figure 9:
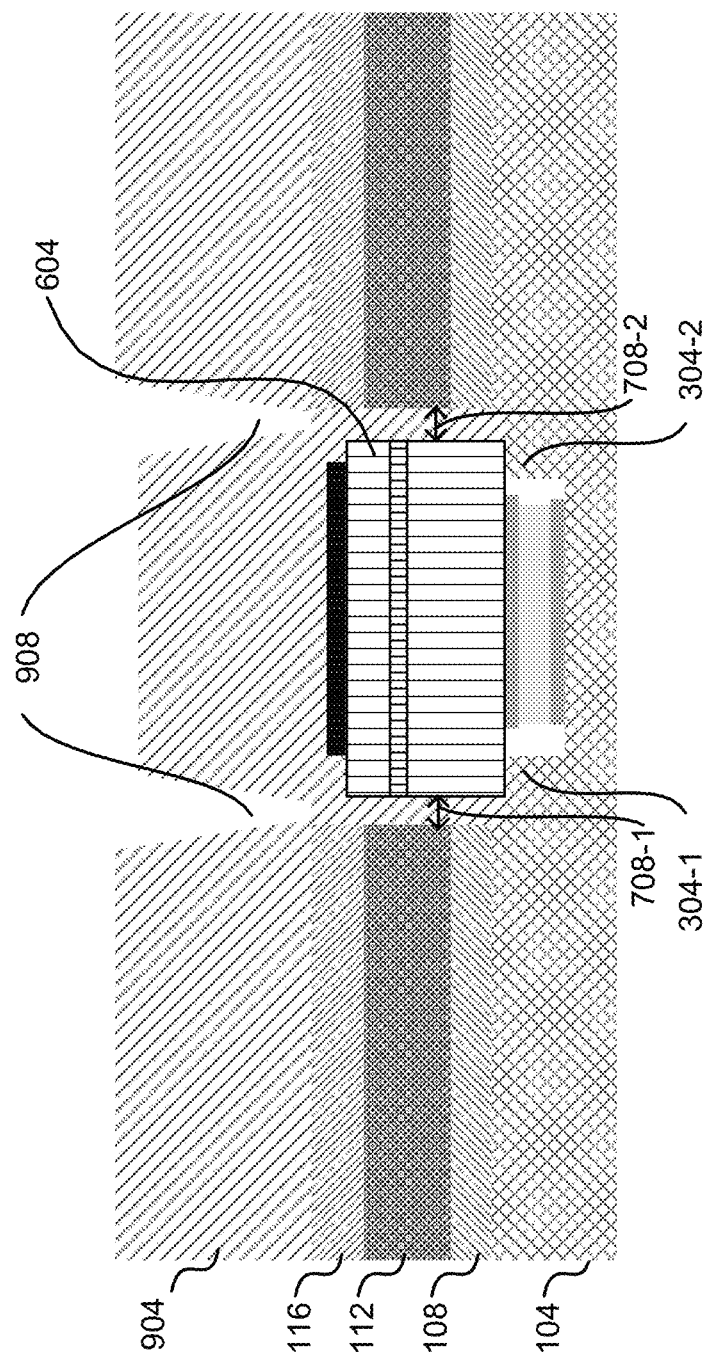
FIG. 9 is a simplified cross-sectional, side view of an embodiment of the composite device having a first material deposited on the composite device.

FIG. 9 is a simplified cross-sectional, side view of an embodiment of the composite device having a first material 904 placed on the composite device. In some embodiments, the first material 904 is SiO2. The first material 904 fills in the gaps 708. Because the first material 904 fills in the gaps 708, trenches 908 are formed in the first material 904.

Figure 10:
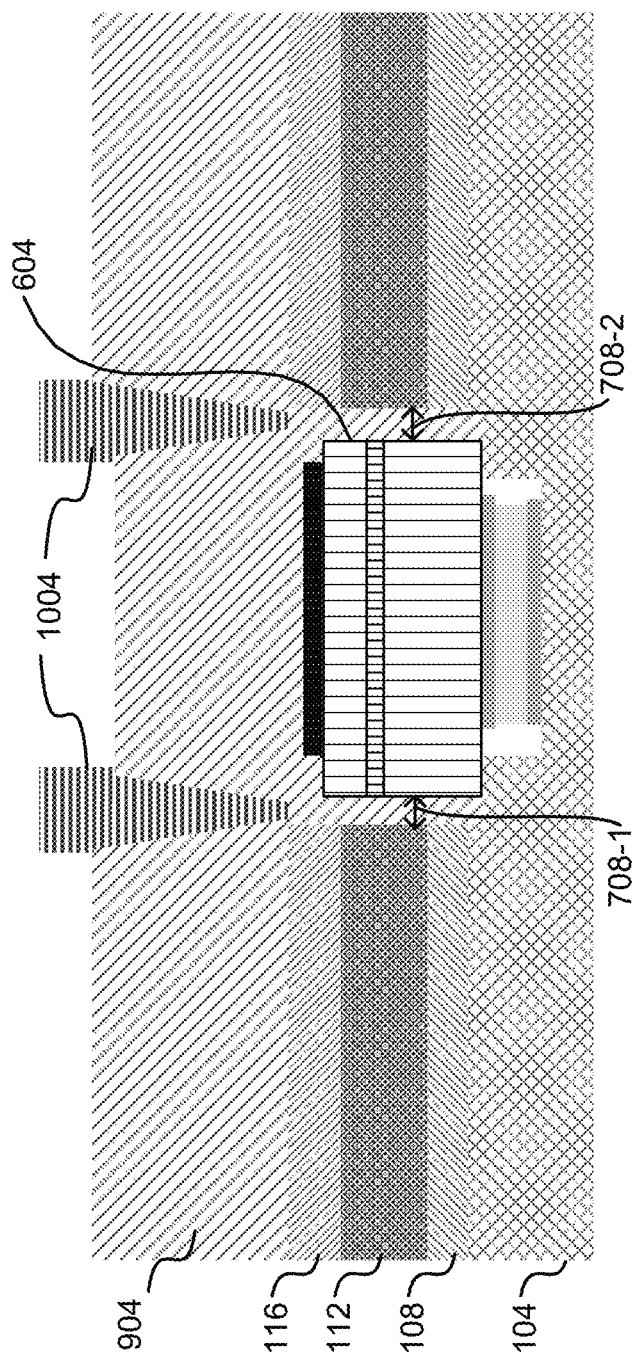
FIG. 10 is a simplified cross-sectional, side view of an embodiment of the composite device with photoresist in trenches formed in the first material.

FIG. 10 is a simplified cross-sectional, side view of an embodiment of the composite device with photoresist 1004 in trenches formed in the first material. The photoresist 1004 covers the gaps 708. In some embodiments, a mask for determining placement of the photoresist 1004 is aligned using the target 212.

Figure 11:
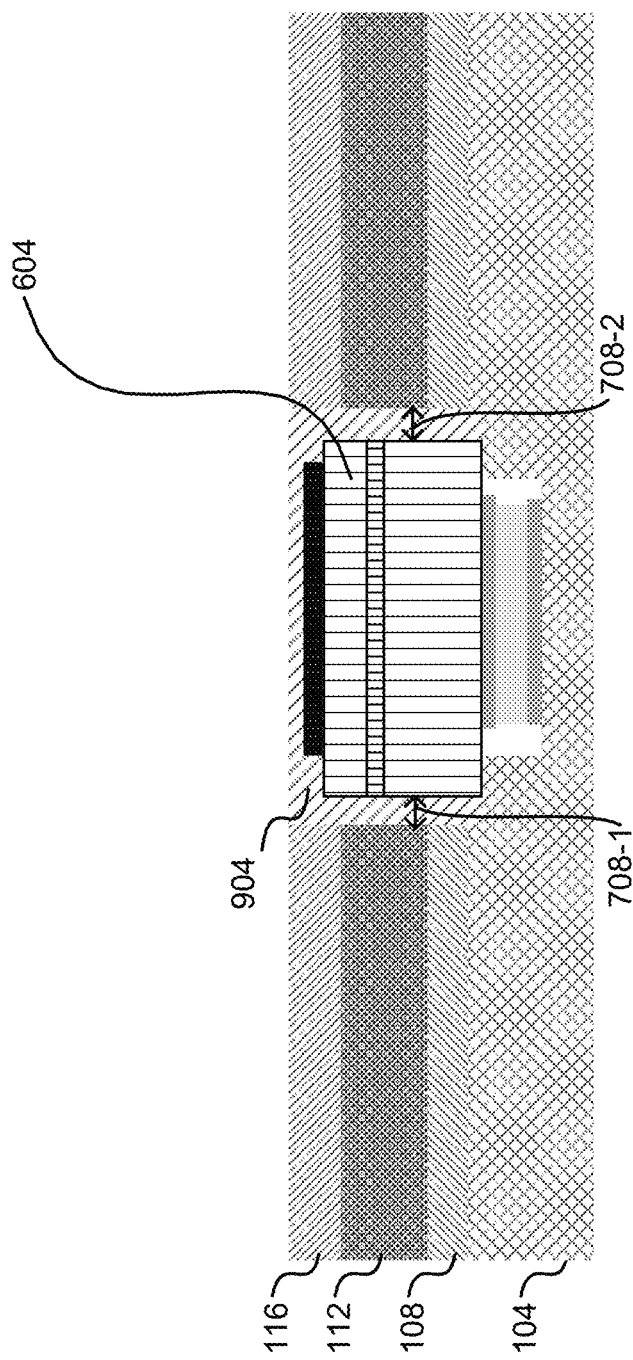
FIG. 11 is a simplified cross-sectional, side view of an embodiment of the composite device with excess first material removed.

FIG. 11 is a simplified cross-sectional, side view of an embodiment of the composite device with excess first material removed. In some embodiments, the first material 904 is etched and/or polished to not extend higher than the platform 100. In some embodiments, an etch stop in or on the upper layer 116 is used to stop etching at the upper layer 116. In some embodiments, a dry etch is used to remove excess of the first material 904, and the composite device is polished using a chemical-mechanical planarization (CMP) polish. In some embodiments, a top surface of the composite device is substantially planar after the excess of the first material has been removed.

Figure 12A:
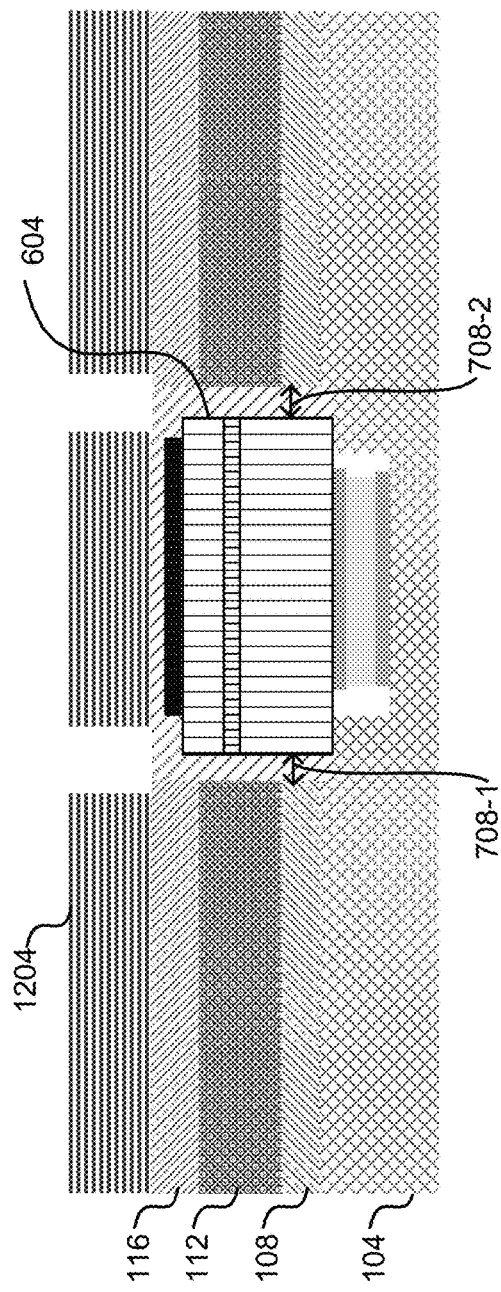
FIG. 12A is a simplified side view of an embodiment of a photoresist applied to the composite device before etching the first material in gaps between the platform and the chip.

FIG. 12A is a simplified side view of an embodiment of a photoresist 1204 applied to the composite device before etching the first material in gaps 708 between the platform 100 and the chip 604. Photoresist 1204 is applied on top of the upper layer 116 and over the chip 604.

Figure 12B:
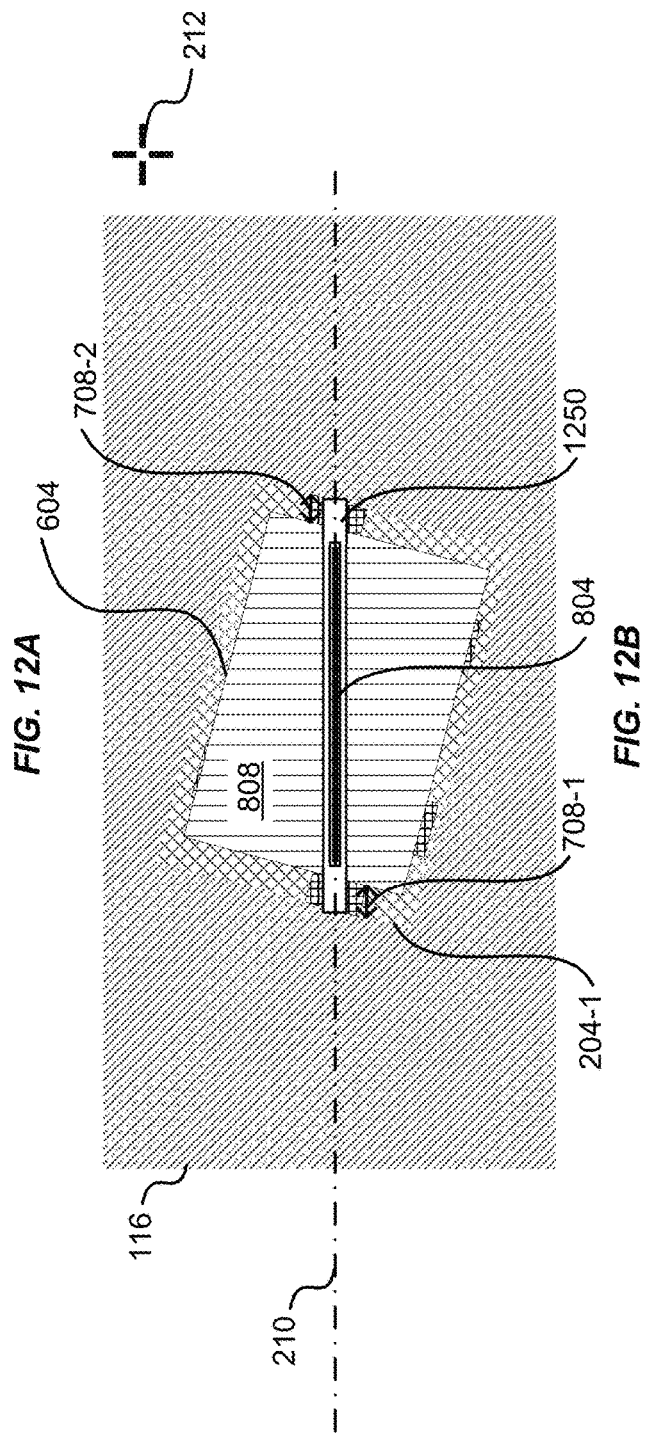
FIG. 12B is a simplified top view of an embodiment of a mask location before etching the first material in the gaps between the platform and the chip.

FIG. 12B is a simplified, top view of an embodiment of a mask location before etching the first material in the gaps between the platform 100 and the chip. FIG. 12B is not a true top view of what would be seen, but instead shows layers of the composite device to better show this embodiment. FIG. 12B shows a top surface of the upper layer 116 and the chip 604 in the recess 408. The contact metal 804 is on the chip surface 808 in a strip above and parallel to the optical path 210. A first window 1250 is also shown. The first window 1250 shows a simplified area of what is to be etched. In this embodiment, the first window 1250 is not open to the contact metal 804, but does open on both sides of the contact metal 804 as well as over the first gap 708-1 and the second gap 708-2. In this embodiment, the first window 1250 opens on both sides of the contact metal 804 as wide as the waveguide 208.

Figure 13:
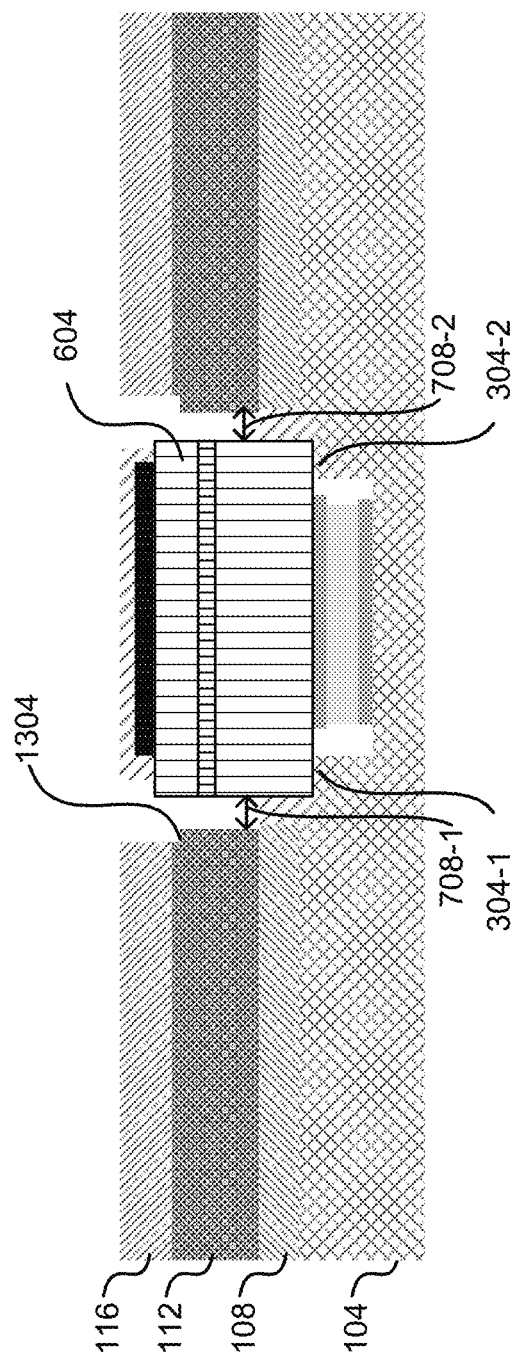
FIG. 13 is a simplified side view of an embodiment of the composite device after the first material is partially removed from the gaps between the platform and the chip.

FIG. 13 is a simplified, side view of an embodiment of the composite device after the first material 904 is partially removed from the gaps 708 between the platform 100 and the chip. The first material 904 in the first gap 708-1 is left to a height of the lower layer 108, and is removed from next to the device layer 112 and the upper layer 116. In some embodiments, the platform 100 is also partially etched though the upper layer 116 and a portion of the device layer 112; for example, etched portion 1304. In some embodiments, the device layer 112 is partially etched to ensure removal of SiO2 between the device layer 112 and the chip 604 and/or to ensure removal of SiO2 where optical bridges 1504 (in FIG. 15) are to be built. In some embodiments, this aids in building the optical bridges 1504.

FIG. 14A is a simplified cross-sectional, side view of an embodiment of the composite device having a second material 1404 deposited on the composite device. In some embodiments, the second material 1404 is amorphous silicon (a-Si). In some embodiments, the second material 1404 has a higher index of refraction than the first material 904. In some embodiments, other high index materials such as silicon nitride, germanium, silicon-germanium, III-V materials, or the like are used. In some embodiments, the second material 1404 is deposited via one or more methods including PECVD, CVD, sputtering, SACVD, combinations thereof, or the like. The second material fills in the gaps 708 where the first material 904 is not present.

FIG. 14B is a simplified cross-sectional, side view of an embodiment of the composite device with excess second material 1404 removed. In some embodiments, the excess second material is removed by a CMP polish. In some embodiments, the a-Si is heated to create poly-silicon. In some embodiments, second material 1404 that is excess is material above the platform 100 (e.g., above the upper layer 116).

Figure 15:
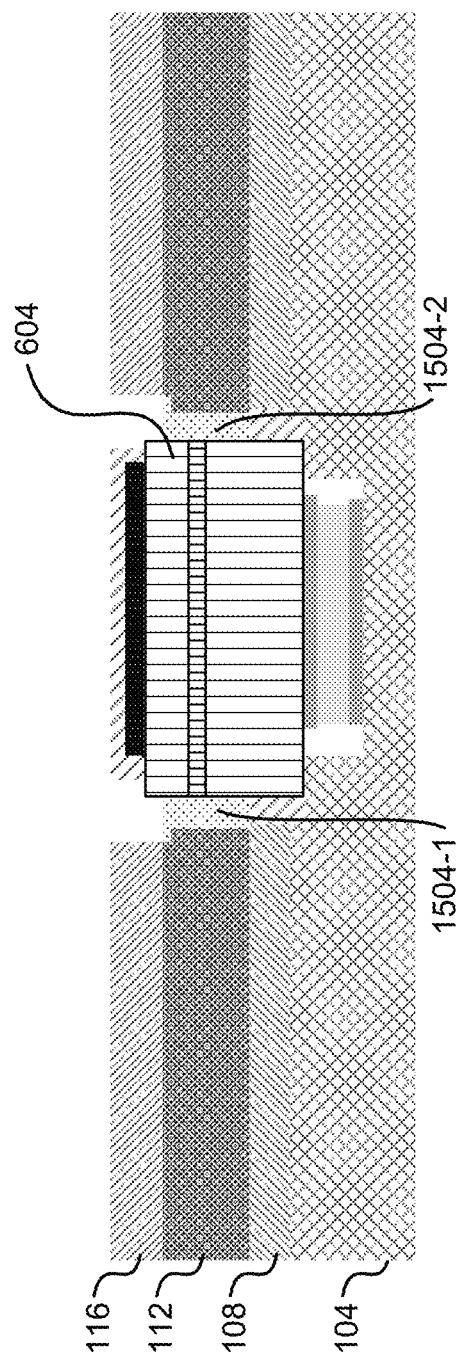
FIG. 15 is a simplified cross-sectional, side view of an embodiment of the composite device after the second material is partially removed from the gaps between the platform and the chip.

FIG. 15 is a simplified cross-sectional, side view of an embodiment of the composite device after the second material 1404 is partially removed from the gaps 708 between the platform 100 and the chip 604. The second material 1404 is removed from a space between the upper layer 116 and the chip 604, but not in the gap 708 between the device layer 112 and the chip 604. The second material forms an optical bridge 1504 between the device layer 112 and the chip 604; the optical bridge having an index of refraction matched to an index of refraction of the device layer 112 and/or the chip 604. In some embodiments, the optical bridge 1504 comprises a ridge waveguide. In some embodiments, the gap 708 is less than 5, 10, 15, and/or 20 microns.

Figure 16:
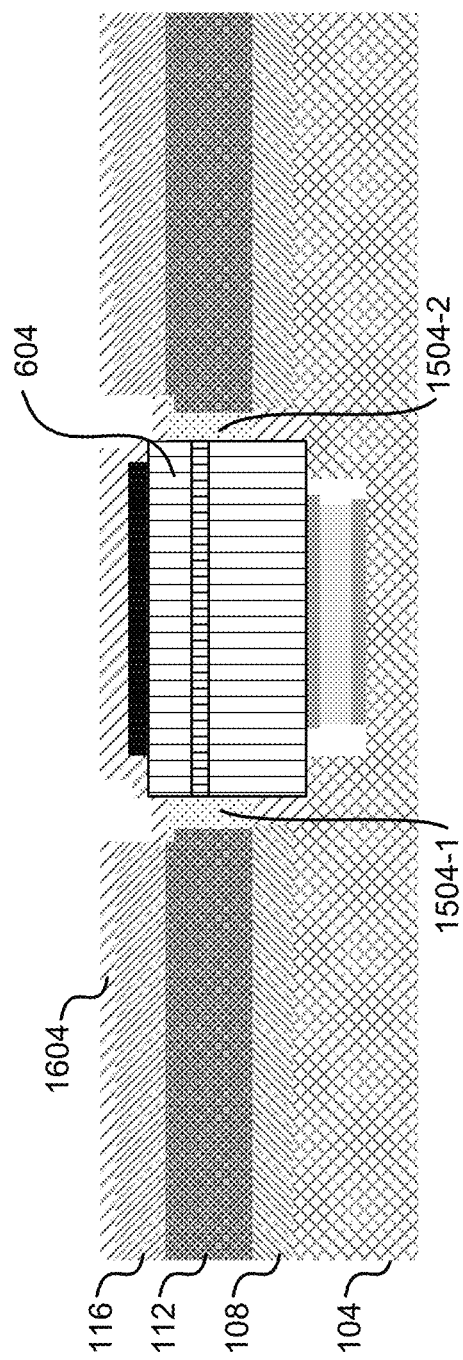
FIG. 16 is a simplified cross-sectional, side view of an embodiment of the composite device having a third material deposited on the composite device.

FIG. 16 is a simplified cross-sectional, side view of an embodiment of the composite device having a third material 1604 deposited on the composite device. In some embodiments, the third material 1604 is SiO2. The third material 1604 covers the optical bridges 1504 and the chip 604.

FIGS. 17A-17C are simplified top views of layers of an embodiment for forming a waveguide on the chip 604 and optical bridges 1504. FIGS. 17A-17C are not true top views of what would be seen, but instead shows layers of the composite device to more clearly show this embodiment. FIG. 17A shows the waveguide 208 in the device layer 112. The chip 604 is in the recess 408. FIG. 17B is a close up view of FIG. 17A. The contact metal 804 is on top of the chip surface 808. A second window has two channels, a first channel 1704-1 and a second channel 1704-2 on either side of the contact metal 804. The first channel 1704-1 and the second channel 1704-2, each have a first width $W_1$ and are separated from the contact metal 804 by a first separation $S_1$. The first channel 1704-1 and the second channel 1704-2 extend longitudinally across the chip 604 and over the first gap 708-1 and the second gap 708-2. Surfaces under the first channel 1704-1 and the second channel 1704-2 are etched to a first depth $D_1$.

In FIG. 17C, a third window has two channels, a third channel 1708-1 and a fourth channel 1708-2, on either side of the contact metal 804. The third channel 1708-1 and the fourth channel 1708-2 each have a second width $W_2$ and are separated from the contact metal 804 by a second separation $S_2$. The third channel 1708-1 and the fourth channel 1708-2 extend longitudinally across the chip 604 and over the first gap 708-1 and the second gap 708-2. Surfaces under the third channel 1708-1 and the fourth channel 1708-2 are etched to a second depth $D_2$.

Figure 18:
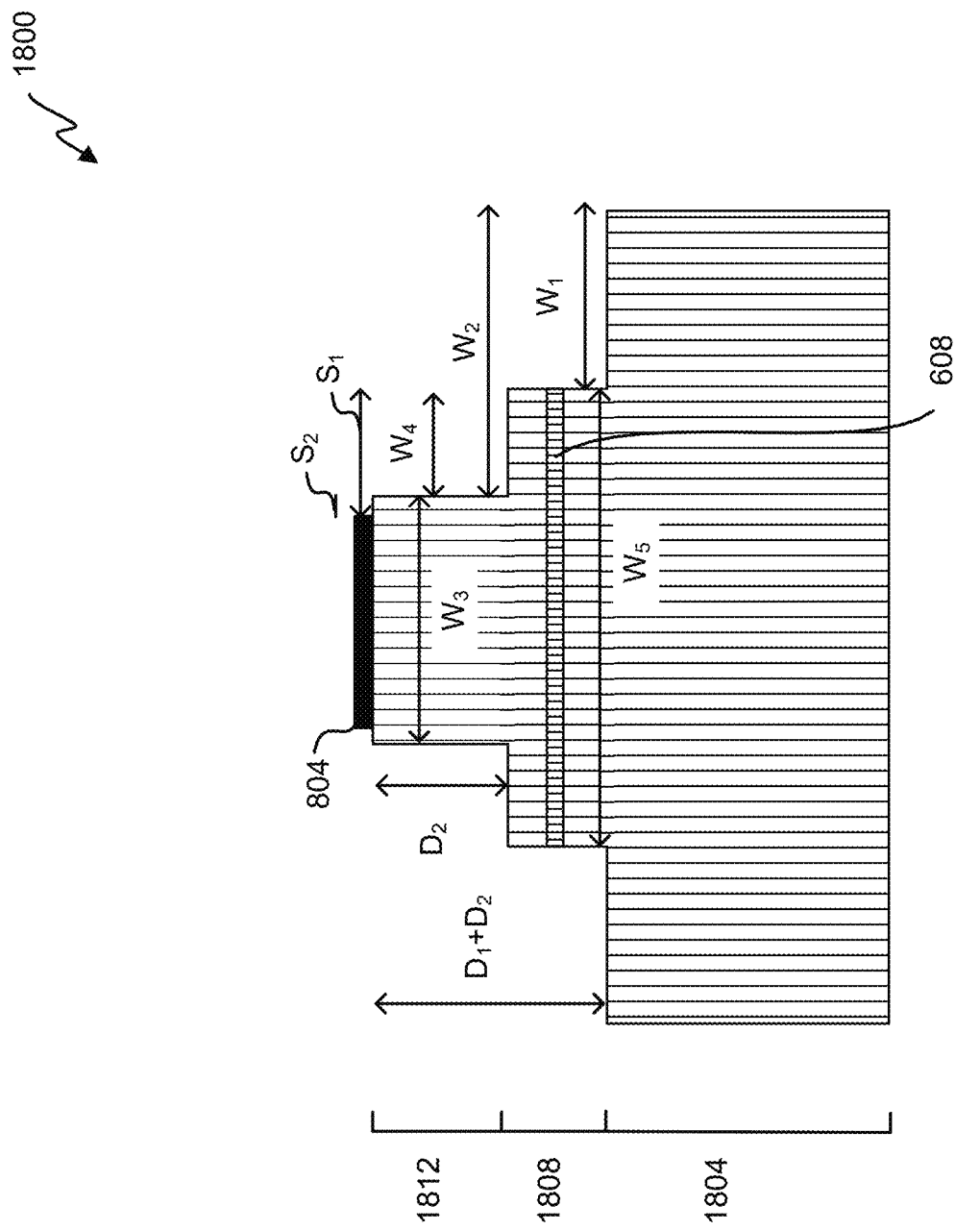
FIG. 18 is a simplified cross-sectional, direction-of-light-propagation view of an embodiment of a waveguide formed in the chip.

FIG. 18 is a simplified cross-sectional, direction-of-light-propagation view of an embodiment of a waveguide 1800 formed in the chip 604 after etching under the second window and the third window is performed. The waveguide 1800 comprises a first layer 1804, a second layer 1808, and a third layer 1812. Light is, at least partially, confined within the second layer 1808 and the third layer 1812. The second layer 1808 comprises the active region 608. The contact metal 804 is on the third layer 1812. The third layer 1812 has a third width, $W_3$, which, in some embodiments, is wider than the contact metal 804. One side of the second layer 1808 extends a fourth width, $W_4$, beyond the third width $W_3$ of the third layer 1812. The fourth width $W_4$ is equal to the second width $W_2$ minus the first width $W_1$ (i.e., $W_4=W_2-W_1$). The second layer 1808 has a fifth width, $W_5$, that is equal to $W_5=W_3+2*W_4$. The third layer 1812 has a height equal to the second depth $D_2$. The second layer 1808 has a height equal to the first depth $D_1$. In some embodiments, etching the second depth $D_2$ is performed before etching the first depth $D_1$. In some embodiments, $D_1$=0.55 µm, $D_2$=0.95 µm; $W_{3=2}$ µm; and $W_4$=1 µm.

Figure 19:
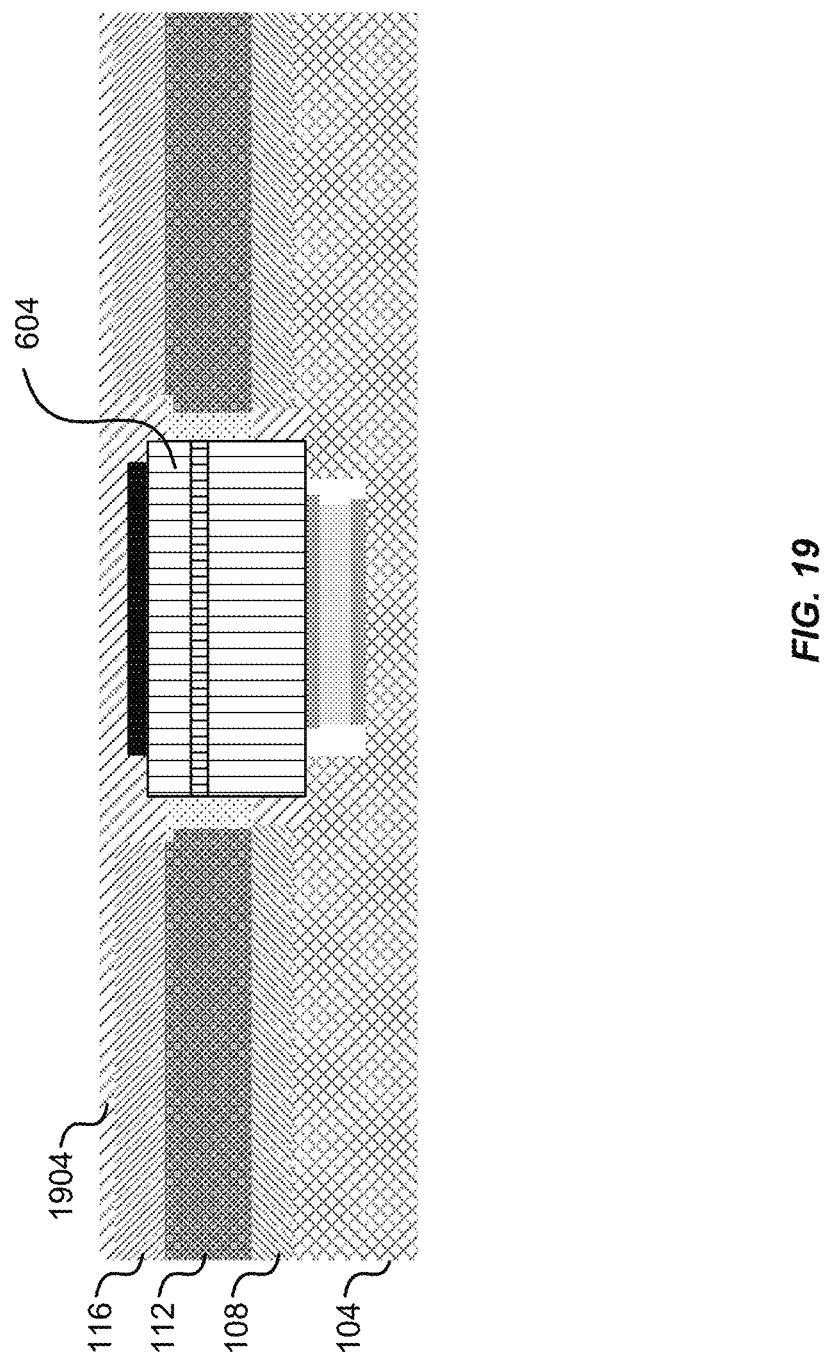
FIG. 19 is a simplified cross-sectional, side view of an embodiment of the composite device covered with a fourth material.

Referring next to FIG. 19 a simplified cross-sectional, side view of an embodiment of the composite device covered with a fourth material 1904 is shown. In some embodiments, the fourth material 1904 hermetically seals the chip 604 in the recess 408 of the platform 100. In some embodiments, the fourth material 1904 is SiO2. In some embodiments, the fourth material 1904 is smoothed to a flat, or relatively flat, surface. In some embodiments, the fourth material above the upper layer 116 is removed and the composite device is polished so that the fourth material 1904 does not extend above the recess 408 of the platform 100.

Figure 20:
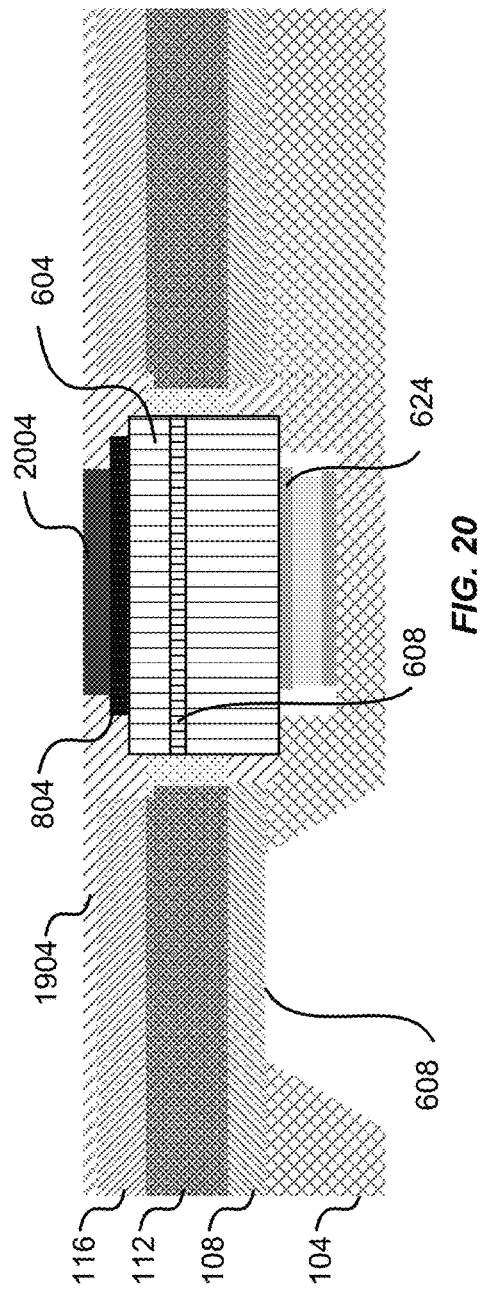
FIGS. 20 and 21 are simplified views of an embodiment for connecting electrical contacts to the chip.
Figure 21:
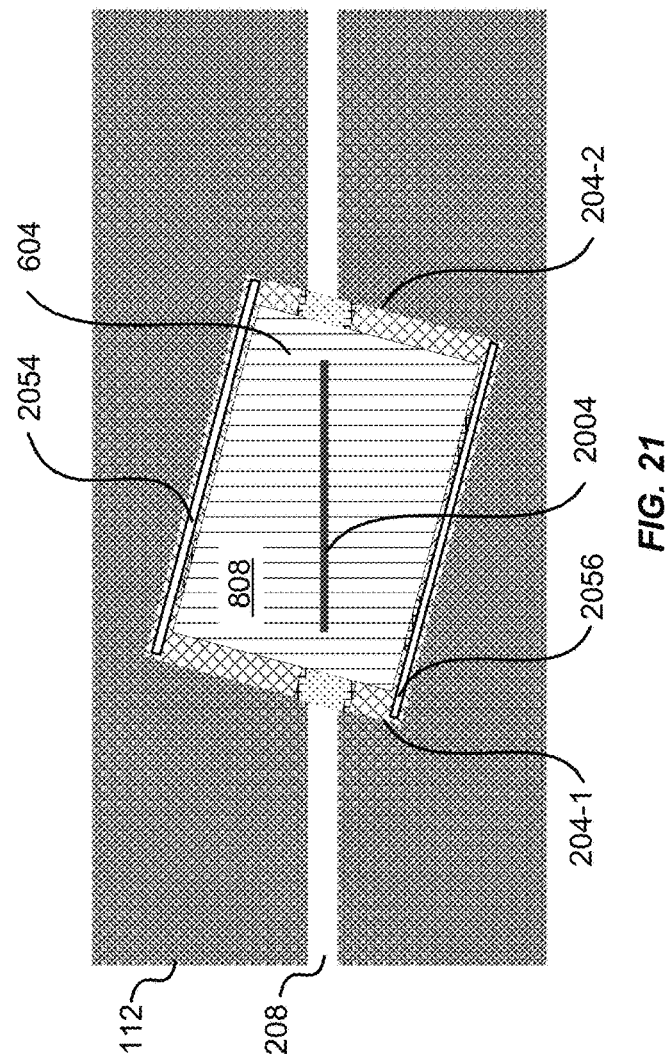

FIGS. 20 and 21 are simplified views of an embodiment for connecting electrical contacts to the chip 604. In FIG. 20, part of the fourth material 1904 is removed and a first lead 2004 is connected to the contact metal 804 on the chip 604. FIG. 20 further shows the platform 100 having been etched on a side opposite the lower layer 108 to form a second opening in the base layer 104. A bottom 608 of the second opening is formed at or near an interface between the base layer 104 and the lower layer 108. In some embodiments, the second opening is to increase thermal impedance. In some embodiments, the platform 100 comprises a grating that changes reflectivity based on temperature (e.g., binary super grating). A thermal source is attached to the grating. In some embodiments, the base layer 108 acts as a heat sink for the platform 100. The second opening increases thermal impedance, thus reducing the thermal source's influence on other elements of the composite device and/or how much current is needed to increase a temperature of the grating. In another example, during bonding, the bonding material 628 is a solder and heated during bonding. The second opening reduces heating of other elements that are part of the platform 100 and/or heat transfer to other parts of the base layer 104 during bonding of the chip to the platform 100.

In FIG. 21, an etch window having a fifth channel 2054 and a sixth channel 2056 is shown. Material in the recess 408 under the fifth channel 2054 and under the sixth channel 2056 are removed for ohmic contacts to be made with the chip contact 624, opposite the chip surface 808. Current flows from the first lead 2004, through the contact metal 804, through the active region 608, through the chip contact 624, and to the ohmic contacts. In some embodiments, a voltage is applied, such as a reverse bias, instead of applying a current.

Figure 22:
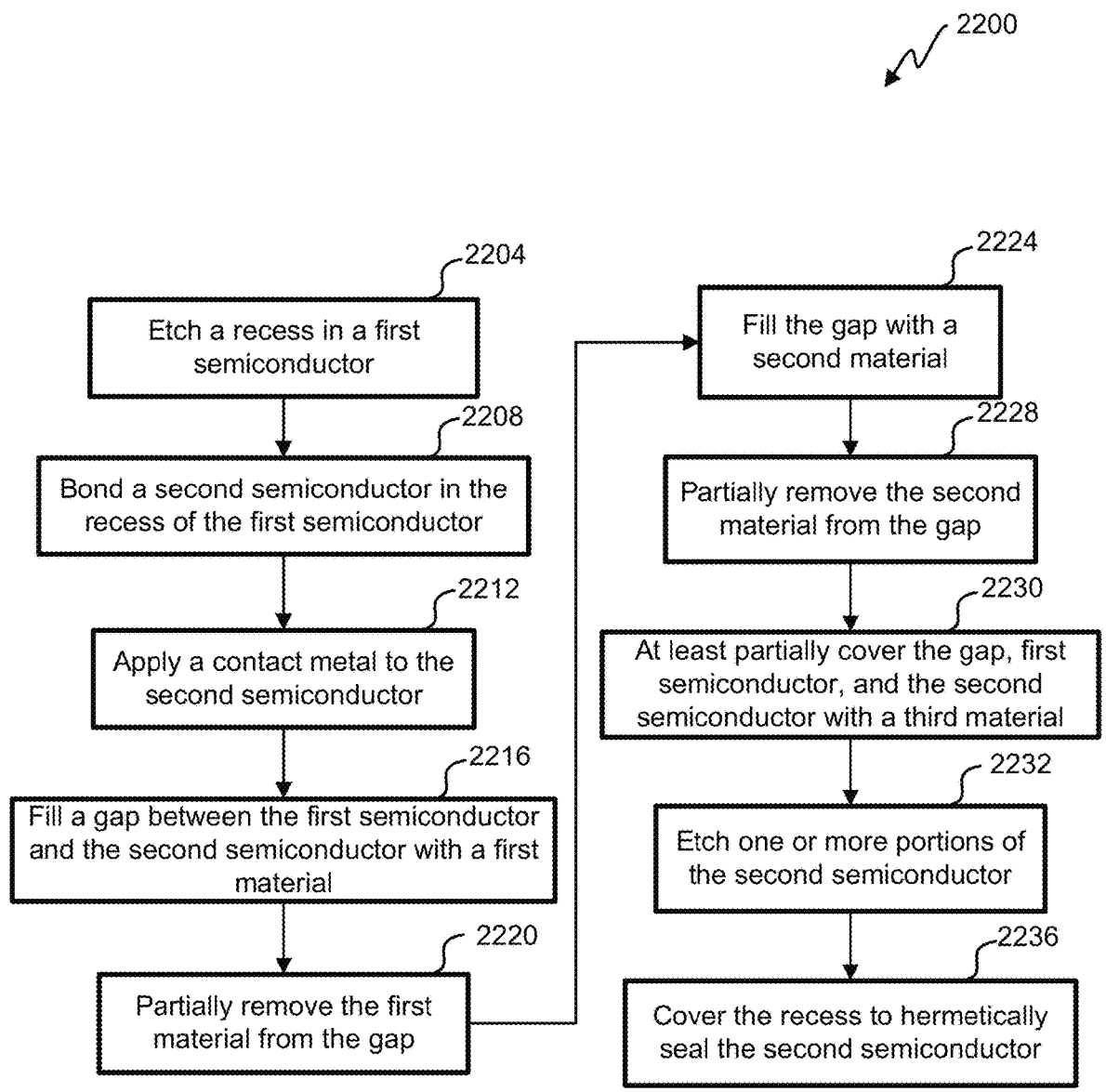
FIG. 22 is a flowchart of an embodiment of a process for creating a composite device.

Referring next to FIG. 22, a flowchart of an embodiment of a first process 2200, for creating a composite device, is shown. The first process 2200 begins in step 2204 where a recess is etched in a platform 100. For example, the recess 408 as described in the discussion of FIG. 2A and/or FIG. 3A. In some embodiments, a first mask is used to define an etching area for the recess, and the first mask is aligned with the target 212. In step 2208, a chip is bonded in the recess 408 of the platform 100. For example, as described in the discussion of FIG. 6A and FIG. 6B. The platform 100 bonded to the chip forms the composite device. In some embodiments, a portion of the chip is removed as described in the discussion of FIG. 6A and FIG. 7.

In step 2212, a contact metal 804 is applied to the chip. In some embodiments, the contact metal 804 is applied to the chip after a portion of the chip is removed (e.g., as described in the discussion of FIGS. 7 and 8). A gap 708, separates a side of the chip and a wall 204 of the recess 408. In step 2216, the gap 708 between the platform 100 and the chip is filled with a first material 904 (e.g., as described in the discussion of FIG. 9 by covering the composite device). In some embodiments, excess portions of the first material 904 are removed (e.g., as described in the discussions of FIGS. 10 and 11). In step 2220, the first material is partially removed from the gap (e.g., as described in the discussions of FIGS. 12A, 12B, and 13). In some embodiments, a second mask is applied that defines an etch area over the gap, before the first material is partially removed, and the second mask is aligned using the target 212. The first material is partially removed by etching. The gap, in step 2224, is then filled with a second material (e.g., as described in the discussions of FIG. 14A and FIG. 14B by covering the composite device with the second material). In step 2228, the second material 1404 is partially removed from the gap 708 (e.g., as described in the discussion of FIG. 15). In some embodiments, the second material forms an optical bridge 1504, which is an optical connector, between the platform 100 and the chip 604. In step 2230, the chip 604 and the optical bridge 1504 are covered with a third material (e.g., as described in the discussion of FIG. 16). In some embodiments, the third material is SiO2.

In step 2232, one or more portions of the chip are etched. For example, to make a waveguide on the chip 604 as described in the discussion of FIGS. 17A-C and 18. Though etching is used in this embodiment to form a feature, other features, such as electrical contacts on the chip, can be formed. Examples of features that can be formed on the chip 604 and/or the platform 100 include current-confinement structures (e.g., trenches and/or ion-implantation regions), electrical contacts, waveguides, reflectors, mirrors, gratings, and beam splitters. For example, a trench could be formed across a path of an optical waveguide in the chip 604 and/or in the platform 100. The trench could act as coupling mirror for a laser cavity. Features are made by processing the chip 604 and/or the platform 100 by patterning, etching, deposition, ion implantation, etc. In some embodiments, the chip 604 is processed to form one or more features on the chip 604 that align with one or more features on the platform 100 (e.g., one or more features on the chip 604 being defined and/or patterned with a mask that is aligned with a target on the platform 100).

In some embodiments, a third mask is used to define an area to remove from the chip to form a feature on the chip. The third mask is aligned using the target 212. In some embodiments, similar features are made and/or applied to the optical bridge 1504. For example, a waveguide is made in the optical bridge 1504 at the same time a waveguide is made on the chip. In some embodiments, a fourth mask is used in defining a second etch area in forming the features. For example, the third mask is used to create an open window as described in FIG. 17B (first channel 1704-1 and second channel 1704-2). And the fourth mask is used to create another open window as described in FIG. 17C (third channel 1708-1 and fourth channel 1708-2). In some embodiments, the third and/or the fourth mask are aligned using the target 212.

In step 2236 the chip is hermetically sealed (e.g., as described in the discussion of FIG. 19 using a fourth material 1904 to cover the chip 604). In some embodiments, ohmic contacts are also added (e.g., as described in FIGS. 20 and 21).

In some embodiments, a target 212 is used for processing both the platform 100 and the chip. In some embodiments, the target 212 is on, or part of, the platform 100. For example, the target 212 (i.e., the same target) is used to align masks for steps 2204, 2212, 2220, 2228, and/or 2232. In some embodiments, using the target 212 for processing the chip after the chip is bonded with the platform 100 allows for tighter processing tolerances and/or reduces having to align a feature (e.g., a waveguide) on the chip with a feature (e.g., a waveguide) on the platform 100 before or during bonding.

Figure 23:
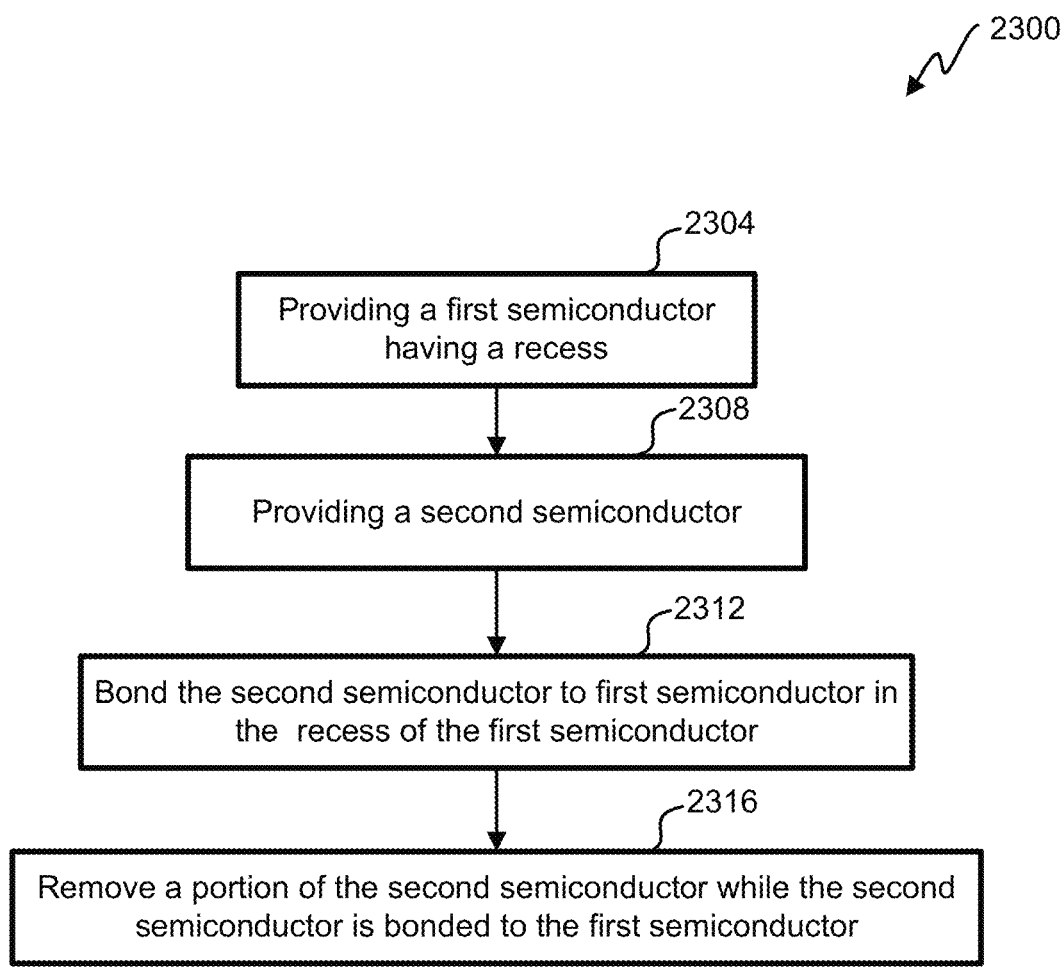
FIG. 23 is another flowchart of an embodiment of a process for creating a composite device.

Referring next to FIG. 23, a flowchart of an embodiment of a second process 2300, for creating a composite device, is shown. The second process 2300 for creating a composite device begins in step 2304 where a platform having a recess is provided. For example, the platform 100 in FIG. 3A is provided. The platform 100 in FIG. 3A has a base layer 104 and a device layer 112, wherein the device layer comprises a plurality of walls 204 forming an opening in the device layer 112 such that a portion of the base layer 104 is exposed through the device layer, as shown in FIGS. 2B and 3B.

In step 2308, a chip is provided. The chip 604 in FIG. 6A is an example of the chip provided in step 2308. In FIG. 6A, the chip 604 has an active region 608 and a substrate 614 (a region extending from the bottom surface 616 to the etch stop 612).

In step 2312, the chip 604 is bonded to the platform 100 in the recess 408 of the platform 100. In some embodiments, the chip 604 is bonded to the platform 100 such that an active region 608 of the chip 604 aligns with the device layer 112 of the platform 100 (i.e., so that the device layer 112 and the active layer 608 share a common horizontal axis and/or so that there is overlap of optical modes in the device layer 112 and the active layer 608; in some embodiments, overlap of optical modes in the device layer 112 and the active layer 608 is maximized). In some embodiments, pedestals 304 are used to align the active region 608 of the chip 604 with the device layer 112.

In some embodiments, the chip extends through the opening in the device layer, and the substrate 614 of the chip 604 extends above the platform 100 (i.e., out of the recess 408). In step 2316, at least a portion of the chip is removed while the chip is bonded to the first semiconductor (e.g., as described in the discussions of FIGS. 6A, 6B, and 7). In some embodiments, the at least a portion of the chip is removed so that the chip does not extend above the platform 100. In some embodiments, the at least a portion of the chip is removed by etching the chip to an etch stop (e.g., etch stop 612 in FIG. 6A) in the chip.

Figure 24A:
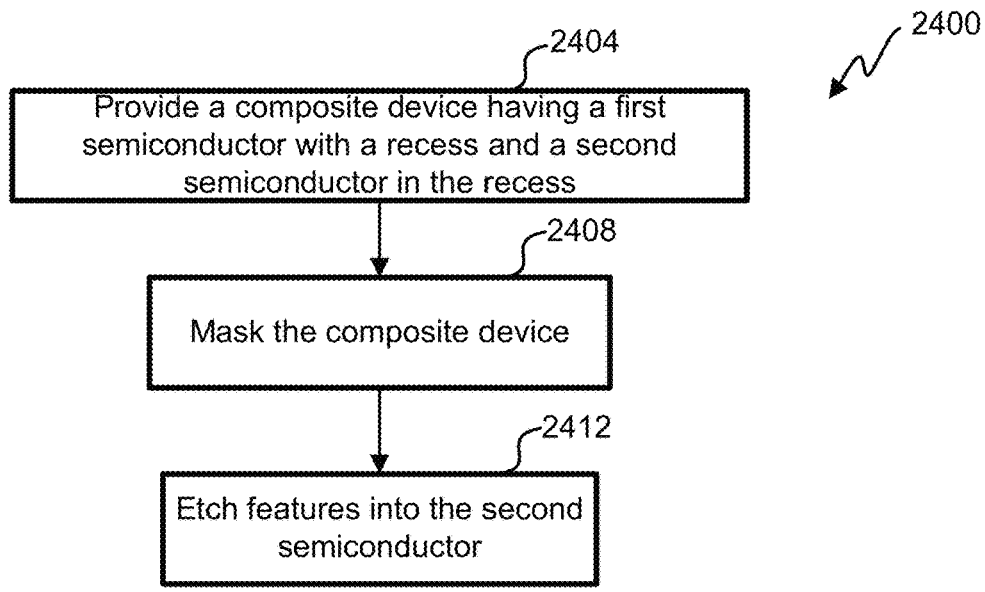
FIG. 24A is a flowchart of an embodiment of a process for processing a chip after bonding to a platform.

Referring next to FIG. 24A, a flowchart of an embodiment of a third process 2400, for processing a chip after bonding to a platform, is shown. The third process 2400 begins in step 2404 by providing a composite device. The composite device comprises a platform with a recess and a chip bonded in the recess of the platform (e.g., the platform 100 bonded to the chip 604 in FIG. 7, 9, or 16).

In step 2408, a mask is applied to the composite device to define an area of the chip to etch. For example, the mask could include an open window like the first channel 1704-1 and the second channel 1704-2 in FIG. 17B. In some embodiments, the mask in step 2408 is aligned using the target 212, which was used previously to align a mask with the platform.

In step 2412, the chip is etched, based on areas exposed by the mask in step 2408, after the chip has been bonded to the platform. In some embodiments, the etching in step 2412 is to form a waveguide, such as the waveguide in FIG. 18.

In some embodiments, optical bridges 1504 are also etched when the chip is etched so that waveguides in the optical bridges 1504 are formed as well. In some embodiments, a second mask is used to define another etch area (e.g., the third channel 1708-1 and the fourth channel 1708-2 in FIG. 17C). In some embodiments, other features are also made in the platform 100. For example, waveguides and gratings, such as binary super-imposed gratings (BSG), are formed in the platform 100 before and/or after bonding the chip to the platform 100. The BSGs are used as mirrors in the silicon to form a laser cavity with the gain medium being the III-V material. In some embodiments, the waveguide formed (e.g., photolithographically) in the chip is formed to align with a waveguide in the platform 100. In some embodiments, a CMOS fab and/or CMOS fabrication techniques are used for etching and/or processing features (e.g., waveguides, mirrors, and/or recesses) on the chip 604 and/or platform 100. Processing the chip 604 (e.g., etching) after the chip is bonded to the platform 100 allows the chip 604 to be "self-aligned" to the platform 100. In some embodiments, having a chip 604 be self-aligned is useful. For example, if a waveguide was formed on the chip 604 before bonding, then the chip 604 would have to be aligned with the platform, sometimes using very narrow tolerances for alignment. By processing the chip 604 (e.g., etching) after bonding the chip 604 to the platform allows alignment of chip 604 features with features in the platform 100 using photolithography techniques, which can be very precise. In particular, if many chips (e.g., greater than 50, 100, 500, 1000, or 3000 chips) are bonded to a single platform 100, aligning the many chips could be time consuming and expensive, as well as less accurate. But by processing the many chips at once (e.g., using photolithography techniques) after the chips 604 are bonded to the platform 100 can speed production and/or provide better aligned chips 604 to the platform 100.

Figure 24B:
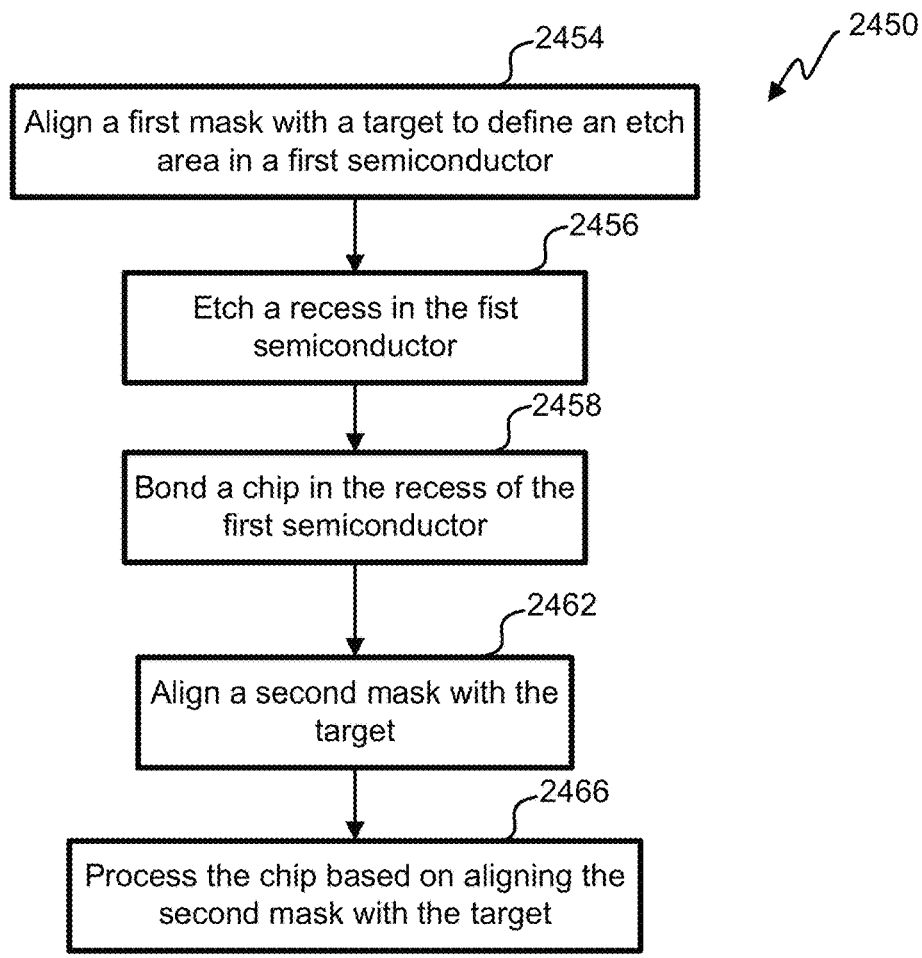
FIG. 24B is another flowchart of an embodiment of a process for processing a chip after bonding to a platform.

Referring next to FIG. 24B, a flowchart of an embodiment of a fourth process 2400, for processing a chip after bonding to a platform 100, is shown. The fourth process 2400 begins in step 2454 by aligning a first mask with a target to define an etch area on a platform. The etch area on the platform is etched, forming a recess in the platform, step 2456 (e.g., forming a recess 408 in the platform 100 as shown in FIGS. 2A and 2B). A chip is bonded in the recess 408 of the platform, step 2458 (e.g., chip 604 in FIG. 7).

In step 2462, a second mask is aligned with the target to define a feature area, wherein the feature area is on the chip. The chip is then processed to form a feature on the chip, step 2466. Examples of processing include adding material and/or removing material (e.g., etching). In some embodiments, the feature is a waveguide. In some embodiments, the feature is a contact metal placed on the chip.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of exemplary embodiments of the invention has been presented for the purposes of illustration and description. It is not intended to be exhaustive or to limit the invention to the precise form described, and many modifications and variations are possible in light of the teaching above. For example, in the embodiments above, the platform 100 comprises four layers: the base layer 104, the lower layer 108, the device layer 112, and the upper layer 116. Additionally, the device layer 112 is processed and the upper layer 116 is placed on the device layer 112 before the opening is etched in the platform 100 to form the recess 408. But in some embodiments, the device layer 112 is unprocessed and/or the upper layer 116 is not present before the platform 100 is etched to form the recess 408. In some embodiments, the chip 604 and the device layer 112 are processed (e.g., waveguides etched in the chip 604 and the device layer 112) after the chip 604 is bonded to the platform 100 (e.g., either at the same time or sequentially).

Further, similar techniques as described above could be used in aligning the chip 604 relative to the platform 100 in order to align an electrical contact (e.g., for a high speed III-V circuit element) and/or to form a planar top surface across both the platform 100 and the chip 604. Further, other devices could be made where functionality is split across two or more materials. In some embodiments, the chip comprises an active region for a detector or a modulator. For example, a Mach-Zehnder interferometer structure could be made in the platform 100 (e.g., of silicon) and one or more chips 604 made of III-V material could be used to modulate a phase change in the interferometer. In some embodiments, the chip 604 comprises a second material that is different from a first material of the platform 100, and the second material is not an epitaxial semiconductor material. For example, in some embodiments, garnet and/or other material (e.g., other non-reciprocal material) is used in the active region of the chip 604 (e.g., material for an active region for a Faraday rotator). For example, one or more isolators and/or circulators are made using garnet (e.g., see U.S. application Ser. No. 13/838,596, filed on Mar. 15, 2013, which is incorporated by reference). In some embodiments, a device (e.g., silicon platform) comprises at least one of a CMOS device, a BiCMOS device, an NMOS device, a PMOS device, a detector, a CCD, diode, heating element, or a passive optical device (e.g., a waveguide, an optical grating, an optical splitter, an optical combiner, a wavelength multiplexer, a wavelength demultiplexer, an optical polarization rotator, an optical tap, a coupler for coupling a smaller waveguide to a larger waveguide, a coupler for coupling a rectangular silicon waveguide to an optical fiber waveguide, and a multimode interferometer). In some embodiments, the platform 100 is homogeneous. In some embodiments, pedestals 304 are formed by etching the platform 100 while creating the recess 408. In some embodiments, pedestals are formed by first etching and then deposition (e.g., epitaxial growth). In some embodiments, the deposition to form the pedestals is a dielectric (e.g., $Si_3N_4$). In some embodiments, the deposition to form the pedestals is a polymer. In some embodiments, the deposition to form the pedestals is a semiconductor (e.g., silicon).

The embodiments were chosen and described in order to explain the principles of the invention and practical applications to thereby enable others skilled in the art to best utilize the invention in various embodiments and with various modifications as are suited to the particular use contemplated.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary.

All patents, patent applications, publications, and descriptions mentioned here are incorporated by reference in their entirety for all purposes. None is admitted to be prior art.

What is claimed is:

1. A method for fabricating a composite device for splitting functionality across two or more materials, the method comprising:
   aligning a first mask with a target to define an etch area on a platform, wherein the platform comprises a first material, and wherein the target is outside the etch area;
   etching a recess in the platform defined by the etch area;
   bonding a chip in the recess of the platform, wherein:
      the chip comprises a substrate, an etch stop layer, and an active region;
      the etch stop layer is between the substrate and the active region;
      the chip is made of a second material; and
      the second material is different from the first material;
   removing the substrate from the chip, after bonding the chip in the recess;
   aligning a second mask with the target to define a feature area, wherein the feature area is over the chip; and
   processing the feature area of the chip to form a feature on the chip after bonding the chip in the recess and removing the substrate from the chip.

2. The method for fabricating the composite device as recited in claim 1, wherein:
   the first material comprises silicon; and
   the second material comprises III-V material.

3. The method for fabricating the composite device as recited in claim 1, wherein the feature is a waveguide.

4. The method for fabricating the composite device as recited in claim 3, wherein the waveguide on the chip is aligned, during processing, with a second waveguide that is part of the platform.

5. The method for fabricating the composite device as recited in claim 1, wherein the feature is a contact metal.

6. The method for fabricating the composite device as recited in claim 1, wherein:
   the platform comprises a silicon-on-insulator (SOI) wafer; and
   etching the recess in the platform comprises etching through both a device layer of the SOI wafer and a BOX layer of the SOI wafer to expose part of a handle of the SOI wafer.

7. The method for fabricating the composite device as recited in claim 1, wherein:
   a gap exists between the chip and the platform;
   the method further comprises filling, at least partially, the gap with a third material; and
   the third material is used to provide an optical connection between the chip and the platform.

8. The method for fabricating the composite device as recited in claim 7, wherein the third material comprises silicon nitride, amorphous silicon, and/or poly-silicon.

9. The method for fabricating the composite device as recited in claim 1, the method further comprising:
   aligning a third mask with the target to define a second feature area; and
   etching the second feature area while the chip is bonded to the platform.

10. The method for fabricating the composite device as recited in claim 1, wherein processing the feature area of the chip comprises using a CMOS fabrication technique.

11. The method for fabricating the composite device as recited in claim 1, wherein the chip comprises a gain medium for a laser, and the platform comprises mirrors to form a resonant cavity for the laser.

12. The method for fabricating the composite device as recited in claim 1, further comprising processing the platform to form a feature on the platform, after bonding the chip in the recess of the platform, wherein the feature on the chip is aligned with the feature on the platform.

13. A method for fabricating a composite device for splitting functionality across two or more materials, the method comprising:
- aligning a first mask with a target to define an etch area on a platform, wherein the platform comprises a first material, and wherein the target is outside the etch area;
- etching a recess in the platform defined by the etch area;
- bonding a chip in the recess of the platform, wherein:
  - the chip comprises a substrate, an etch stop layer, and an active region;
  - the etch stop layer is between the substrate and the active region;
  - the chip is made of a second material; and
  - the second material is different from the first material;
- removing the substrate from the chip, after bonding the chip in the recess;
- aligning a second mask with the target to define a feature area, wherein the feature area is over the chip; and
- processing the feature area of the chip to form a waveguide on the chip after bonding the chip in the recess and removing the substrate from the chip, wherein:
  - the waveguide on the chip is aligned with a waveguide on the platform;
  - the chip comprises a gain medium for a laser; and
  - the platform comprises mirrors to form a resonant cavity for the laser.

14. The method of claim 13, further comprising:
aligning a third mask with the target to define a second feature area; and
etching the second feature area while the chip is bonded to the platform.

15. A method for fabricating a composite device for splitting functionality across two or more materials, the method comprising:
- etching a recess in a platform by aligning a first mask with a target, wherein the target is outside the recess;
- bonding a chip in the recess, wherein:
  - the chip comprises a substrate, an etch stop layer, and an active region;
  - the etch stop layer is between the active region and the substrate;
  - the platform comprises a first material;
  - the chip comprises a second material; and
  - the second material is different from the first material;
- removing the substrate from the chip, after bonding the chip in the recess;
- processing the platform to form a feature on the platform, after bonding the chip in the recess of the platform; and
- processing, by aligning a second mask with the target, the chip to form a feature on the chip to align with the feature on the platform, after bonding the chip in the recess of the platform and removing the substrate from the chip.

16. The method of claim 15, wherein the feature in the platform is a first waveguide and the feature in the chip is a second waveguide so that the first waveguide in the platform and the second waveguide in the chip are aligned after processing the platform and processing the chip.

17. The method of claim 15, further comprising:
aligning a third mask with the target to define a second feature area; and
etching the second feature area while the chip is bonded to the platform.

18. The method of claim 15, wherein:
a gap exists between the chip and the platform;
the method further comprises filling, at least partially, the gap with a third material; and
the third material is used to provide an optical connection between the chip and the platform.

19. The method of claim 15, wherein processing the chip comprises using a CMOS fabrication technique.

20. The method of claim 15, wherein the chip comprises a gain medium for a laser, and the platform comprises mirrors to form a resonant cavity for the laser.

* * * * *